(12) United States Patent
Yuan et al.

(10) Patent No.: US 10,901,050 B2
(45) Date of Patent: Jan. 26, 2021

(54) MAGNETIC FIELD SENSING DEVICE INCLUDING MAGNETORESISTOR WHEATSTONE BRIDGE

(71) Applicants: Fu-Te Yuan, New Taipei (TW); Meng-Huang Lai, New Taipei (TW)

(72) Inventors: Fu-Te Yuan, New Taipei (TW); Meng-Huang Lai, New Taipei (TW)

(73) Assignee: iSentek Inc., New Taipei (TW)

( * ) Notice: Subject to any disclaimer, the term of this patent is extended or adjusted under 35 U.S.C. 154(b) by 75 days.

(21) Appl. No.: 16/226,662

(22) Filed: Dec. 20, 2018

(65) Prior Publication Data

US 2019/0195968 A1 Jun. 27, 2019

Related U.S. Application Data

(60) Provisional application No. 62/609,257, filed on Dec. 21, 2017.

(51) Int. Cl.
*G01R 33/09* (2006.01)
*G01R 33/02* (2006.01)
*G01R 33/00* (2006.01)

(52) U.S. Cl.
CPC ....... *G01R 33/096* (2013.01); *G01R 33/0005* (2013.01); *G01R 33/0094* (2013.01);
(Continued)

(58) Field of Classification Search
CPC ... H01L 43/08; H01L 27/22; H01L 2924/181; H01L 2924/19105; H01L 21/4825;
(Continued)

(56) References Cited

U.S. PATENT DOCUMENTS 6,075,361 A * 6/2000 Coehoorn .............. B82Y 25/00
                                                     324/252
6,724,186 B2 * 4/2004 Jordil .................... G01B 3/205
                                                 324/207.21
(Continued)

FOREIGN PATENT DOCUMENTS

| TW | 201329479 | 7/2013 |
|----|-----------|--------|
| TW | I412776 | 10/2013 |

(Continued)

OTHER PUBLICATIONS

"Office Action of Taiwan Counterpart Application," dated Aug. 5, 2019, p. 1-p. 5.

*Primary Examiner* — Vinh P Nguyen
(74) *Attorney, Agent, or Firm* — JCIPRNET

(57) ABSTRACT

A magnetic field sensing device including a plurality of first magnetoresistor units and a plurality of second magnetoresistor units is provided. Magnetic field sensing axes of the first magnetoresistor units are parallel to a plane formed by a first direction and a third direction and are inclined with respect to the first direction and the third direction. Magnetic field sensing axes of the second magnetoresistor units are parallel to a plane formed by a second direction and the third direction and are inclined with respect to the second direction and the third direction. The first magnetoresistor units and the second magnetoresistor units are configured to measure a plurality of magnetic field components in a plurality of directions in three-dimensional space in a plurality of different time periods, respectively.

17 Claims, 16 Drawing Sheets

(52) U.S. Cl.
CPC ....... *G01R 33/0206* (2013.01); *G01R 33/091* (2013.01); *G01R 33/0023* (2013.01)

(58) Field of Classification Search
CPC . H01L 25/0657; H01L 24/47; H01L 29/7869; H01L 39/128; H01L 43/04; H01L 43/065; H01L 43/14; G01R 33/093; G01R 33/09; G01R 33/0094; G01R 15/205; G01R 33/0005; G01R 33/091; G01R 33/0011; G01R 33/0052; G01R 33/096; G01R 33/025; G01R 33/072; G01R 33/07; G01R 33/0047; G01R 33/0206; G01R 15/148; G01R 33/02; G01R 31/2829; G01R 33/00; G01R 33/075; G01R 33/095; G01R 33/0023; A61B 90/98; A61B 2090/064; A61B 2017/00039; A61B 2017/00876; A61B 2034/2051; A61B 2018/00875; G01D 5/16; G01D 3/0365; H01H 9/0271; H01R 13/5219; H04B 17/18; H04B 17/29; H04B 5/0075

See application file for complete search history.

(56) References Cited

U.S. PATENT DOCUMENTS

| | | | |
|---|---|---|---|
| 7,358,722 B2* | 4/2008 | Peczalski | B82Y 25/00 324/247 |
| 7,425,824 B2 | 9/2008 | Busch | |
| 8,508,221 B2* | 8/2013 | Sun | H01L 43/12 324/249 |
| 9,018,946 B2* | 4/2015 | Paci | B82Y 25/00 324/228 |
| 9,562,953 B2* | 2/2017 | Yuan | G01R 33/0206 |
| 10,302,712 B2* | 5/2019 | Yuan | G01R 33/096 |
| 2014/0176132 A1 | 6/2014 | Chen et al. | |
| 2018/0128887 A1 | 5/2018 | Yuan et al. | |
| 2020/0064379 A1* | 2/2020 | Yuan | G01R 15/205 |

FOREIGN PATENT DOCUMENTS

| | | |
|---|---|---|
| TW | 201640134 | 11/2016 |
| TW | I565958 | 1/2017 |
| TW | 201818050 | 5/2018 |
| WO | 0194963 | 12/2001 |

* cited by examiner

MAGNETIC FIELD SENSING DEVICE INCLUDING MAGNETORESISTOR WHEATSTONE BRIDGE

CROSS-REFERENCE TO RELATED APPLICATION

This application claims the priority benefit of U.S. provisional application Ser. No. 62/609,257, filed on Dec. 21, 2017. The entirety of the above-mentioned patent application is hereby incorporated by reference herein and made a part of this specification.

BACKGROUND

Technical Field

The invention relates to a magnetic field sensing device.

Description of Related Art

As portable electronic devices become prevalent, electronic compass technology capable of sensing a geomagnetic direction has come to attention. When an electronic compass is applied to small-sized portable electronic devices (e.g., a smartphone), it is desired that the electronic compass is capable of three-axial sensing in addition to meeting the small-size requirement, since the mobile phone may be tilted when held by a user, and various holding angles are possible. Moreover, the electronic compass is also applicable to drones (e.g., a remotely controlled aircraft, a remotely controlled helicopter, etc.), and in that case, it is desired that the electronic compass is capable of three-axial sensing.

In the prior art, sensing of a magnetic field is generally performed by using anisotropic magnetoresistors (AMRs) under the framework of Wheatstone bridge. However, the conventional magnetic field sensing device generally requires a larger layout area, which increases the manufacturing costs.

SUMMARY

The invention provides a magnetic field sensing device capable of achieving measurement of magnetic field components in a plurality of dimensions with a simplified structure and reduced volume.

A magnetic field sensing device provided by an embodiment of the invention includes a plurality of first magnetoresistor units and a plurality of second magnetoresistor units. The first magnetoresistor units are disposed in three-dimensional space formed by a first direction, a second direction, and a third direction. Magnetic field sensing axes of the first magnetoresistor units are parallel to a plane formed by the first direction and the third direction and are inclined with respect to the first direction and the third direction. The second magnetoresistor units are disposed in the three-dimensional space. Magnetic field sensing axes of the second magnetoresistor units are parallel to a plane formed by the second direction and the third direction and are inclined with respect to the second direction and the third direction. The first magnetoresistor units and the second magnetoresistor units are electrically connected to form a plurality of different kinds of Wheatstone bridges in a plurality of different time periods, respectively, or are electrically connected to form one kind of Wheatstone bridge in the different time periods, but the first magnetoresistor units and the second magnetoresistor units connected by the one kind of Wheatstone bridge are switched into a plurality of different magnetization direction combinations in the different time periods, respectively, so as to measure a plurality of magnetic field components in a plurality of directions in the three-dimensional space.

To sum up, in the magnetic field sensing device provided by the embodiments of the invention, the magnetic field sensing axes of the first magnetoresistor units are parallel to the plane formed by the first direction and the third direction and are inclined with respect to the first direction and the third direction. Further, the magnetic field sensing axes of the second magnetoresistor units are parallel to the plane formed by the second direction and the third direction and are inclined with respect to the second direction and the third direction. Therefore, the magnetic field sensing device provided by the embodiments of the invention can have a simplified structure and simultaneously realize magnetic field measurement in multiple dimensions, and thus, the magnetic field sensing device features smaller volume and advantages of increasing flexibility in application and lowering the manufacturing costs.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1A:
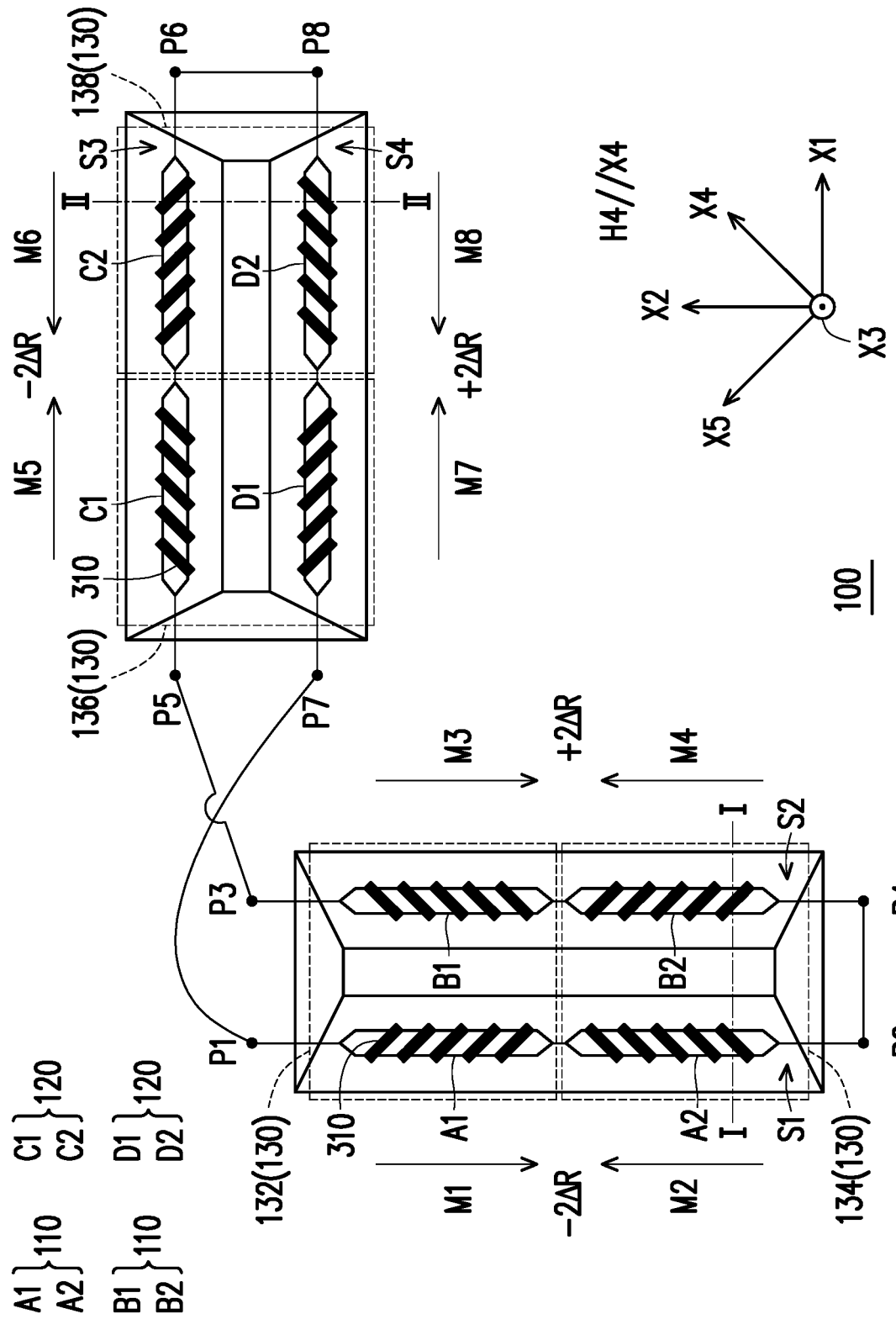
FIG. 1A, FIG. 1B, and FIG. 1C are schematic top views of a magnetic field sensing device according to an embodiment of the invention and respectively illustrate parameter changes caused by magnetic field components of an external magnetic field in a fourth direction, a fifth direction, and a third direction.
Figure 1B:
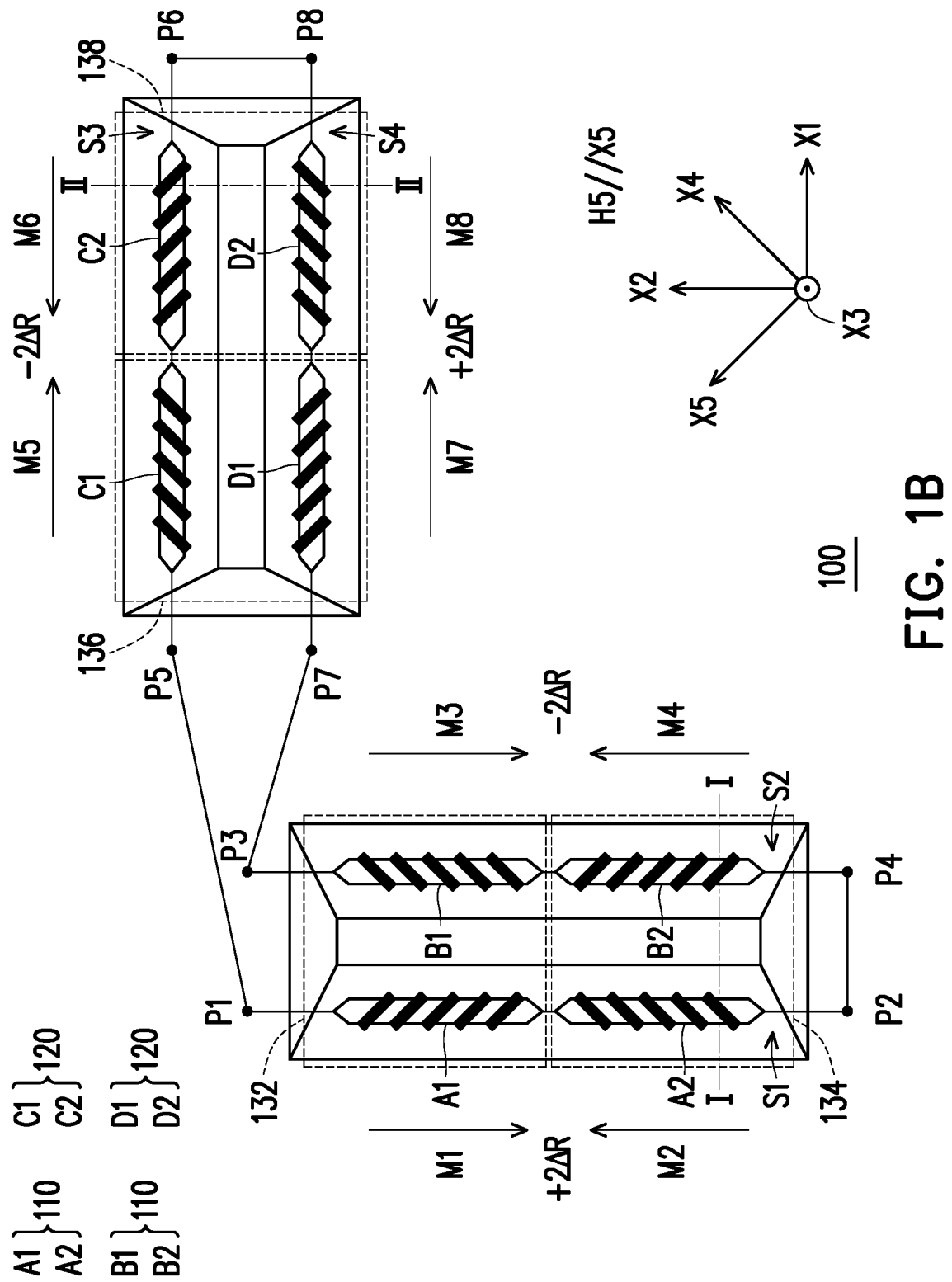
Figure 1C:
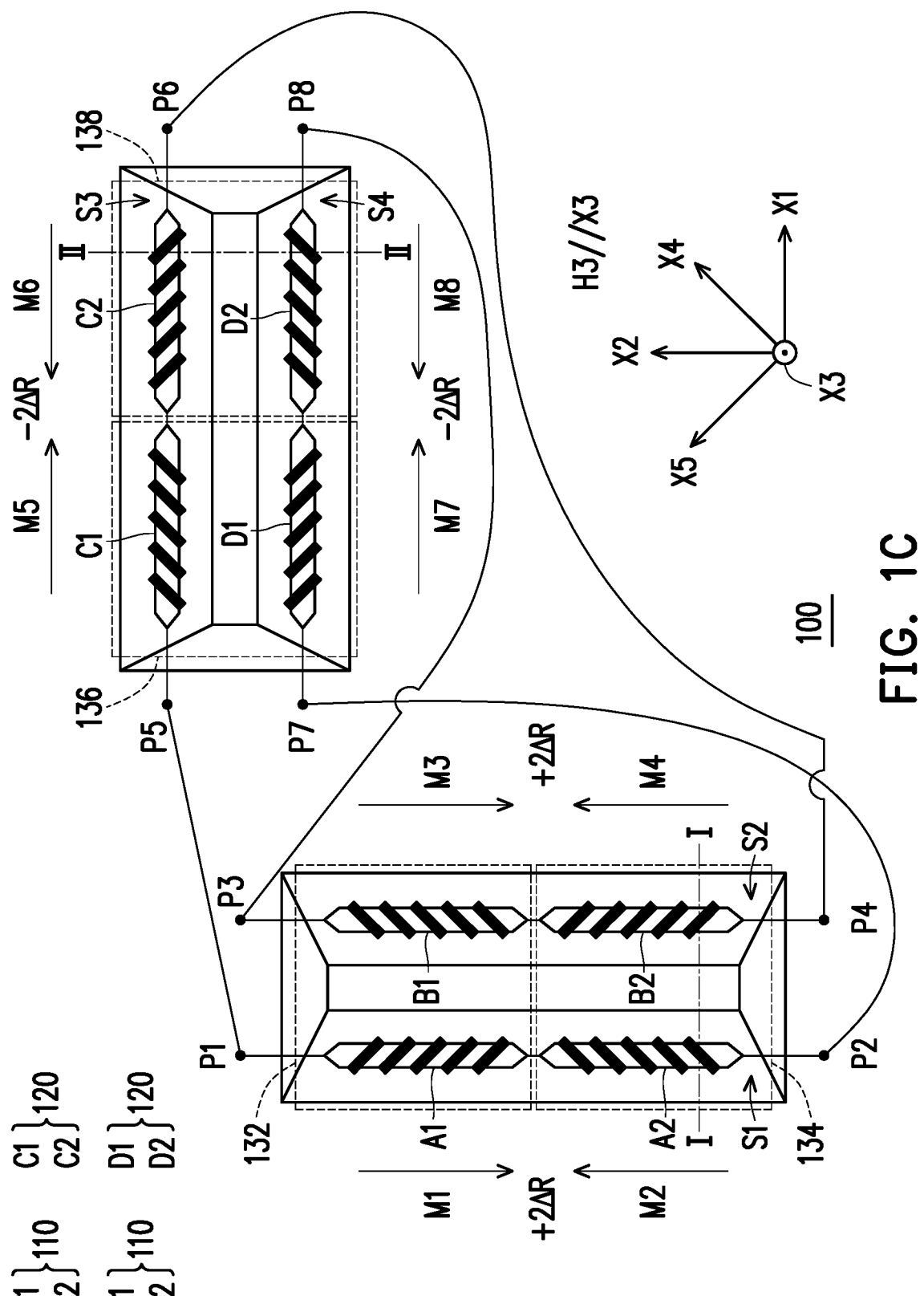
Figure 2A:
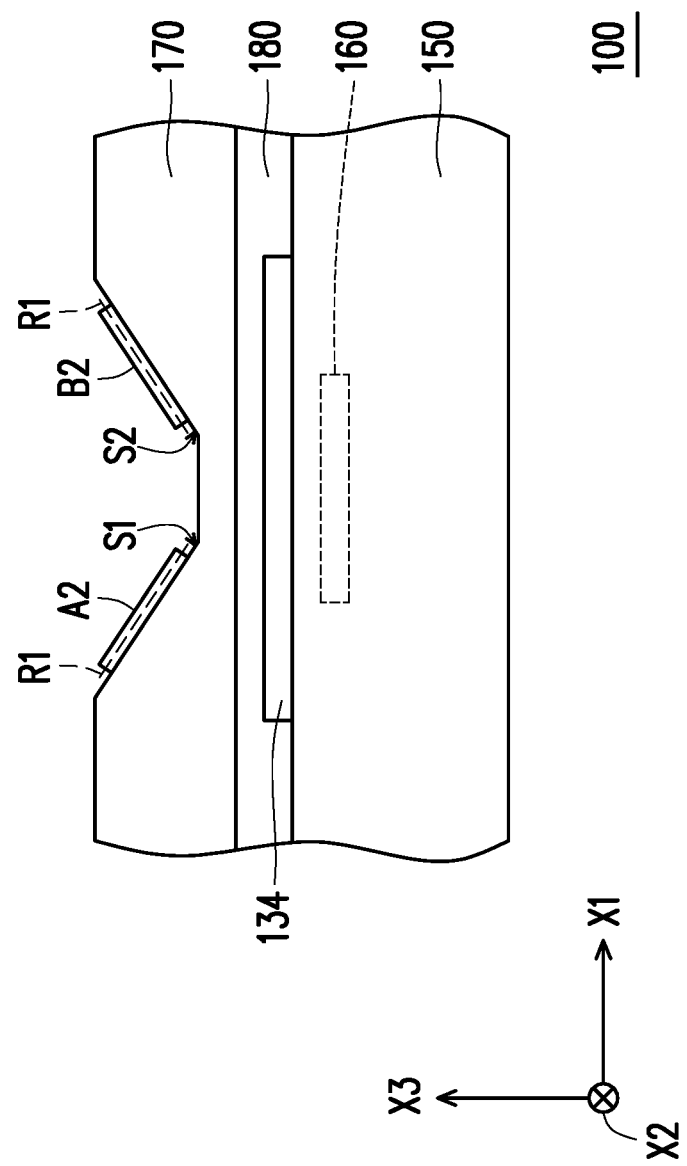
FIG. 2A is a schematic cross-sectional view of the magnetic field sensing device in FIG. 1A along a line I-I.
Figure 2B:
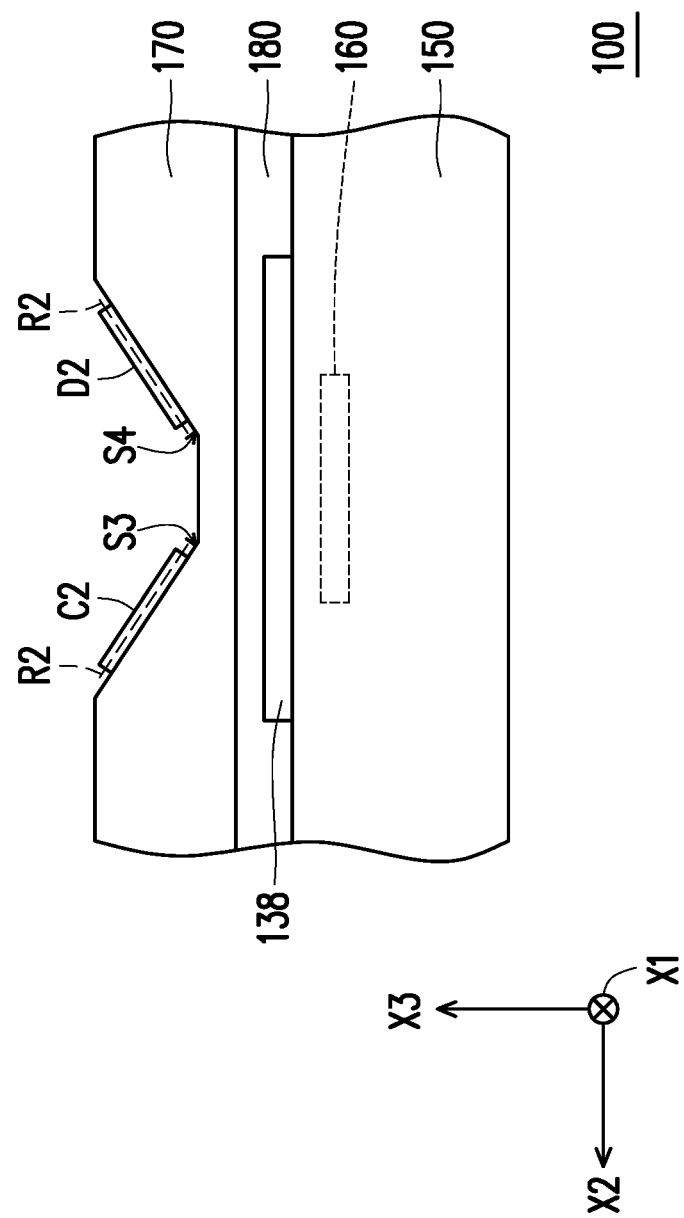
FIG. 2B is a schematic cross-sectional view of the magnetic field sensing device in FIG. 1A along a line II-II.

FIG. 1A, FIG. 1B, and FIG. 1C are schematic top views of a magnetic field sensing device according to an embodiment of the invention and respectively illustrate parameter changes caused by magnetic field components of an external magnetic field in a fourth direction, a fifth direction, and a third direction. FIG. 2A is a schematic cross-sectional view of the magnetic field sensing device of FIG. 1A taken along a line I-I, and FIG. 2B is a schematic cross-sectional view of the magnetic field sensing device of FIG. 1A taken along a line II-II. With reference to FIG. 1A, FIG. 1B, FIG. 1C, FIG. 2A, and FIG. 2B, a magnetic field sensing device 100 of this embodiment includes a plurality of first magnetoresistor units 110 and a plurality of second magnetoresistor units 120. The first magnetoresistor units 110 are disposed in three-dimensional space formed by a first direction X1, a second direction X2, and a third direction X3. Herein, magnetic field sensing axes R1 (e.g., as shown in FIG. 2A) of the first magnetoresistor units 110 are parallel to a plane formed by the first direction X1 and the third direction X3 and are inclined with respect to the first direction X1 and the third direction X3. The second magnetoresistor units 120 are disposed in the three-dimensional space. Herein, magnetic field sensing axes R2 (e.g., as shown in FIG. 2B) of the second magnetoresistor units 120 are parallel to a plane formed by the second direction X2 and the third direction X3 and are inclined with respect to the second direction X2 and the third direction X3.

In this embodiment, each of the first magnetoresistor units 110 and the second magnetoresistor units 120 includes at least one anisotropic magnetoresistor. For instance, two first magnetoresistor units 110 are taken as an example in FIG. 1A. One first magnetoresistor unit 110 including an anisotropic magnetoresistor A1 and an anisotropic magnetoresistor A2 is taken as an example, and the other first magnetoresistor unit 110 including an anisotropic magnetoresistor B1 and an anisotropic magnetoresistor B2 is taken as an example. In addition, two second magnetoresistor units 120 are taken as an example in FIG. 1A. One second magnetoresistor unit 120 including an anisotropic magnetoresistor C1 and an anisotropic magnetoresistor C2 is taken as an example, and the other second magnetoresistor unit 120 including an anisotropic magnetoresistor D1 and an anisotropic magnetoresistor D2 is taken as an example.

In this embodiment, the magnetic field sensing device 100 further includes a plurality of magnetization direction setting devices 130 (e.g., the magnetization direction setting devices 132, 134, 136, and 138) respectively disposed beside the first magnetoresistor units 110 and the second magnetoresistor units 120 to respectively set magnetization directions of the first magnetoresistor units 110 and the second magnetoresistor units 120.

Figure 3A:
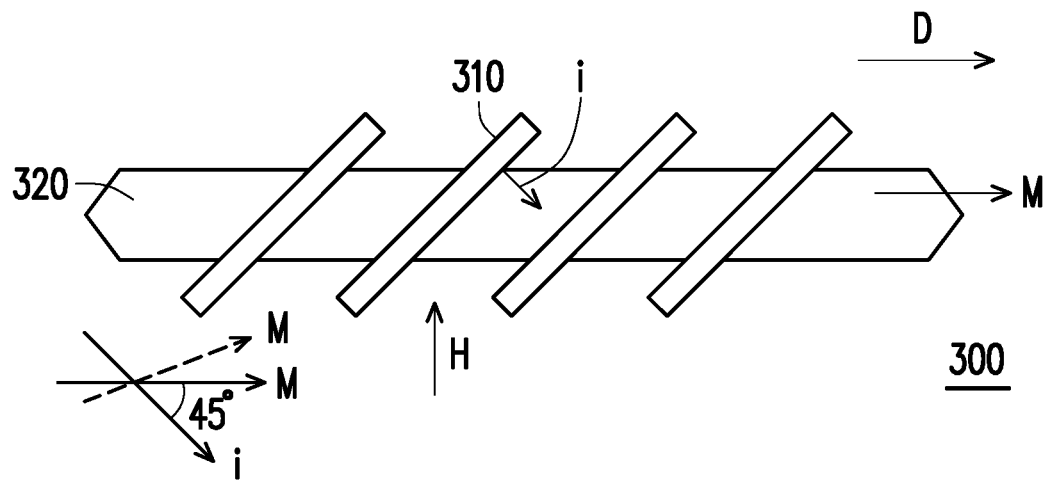
FIG. 3A and FIG. 3B illustrate an operation principle of the anisotropic magnetoresistors in FIG. 1A.
Figure 3B:
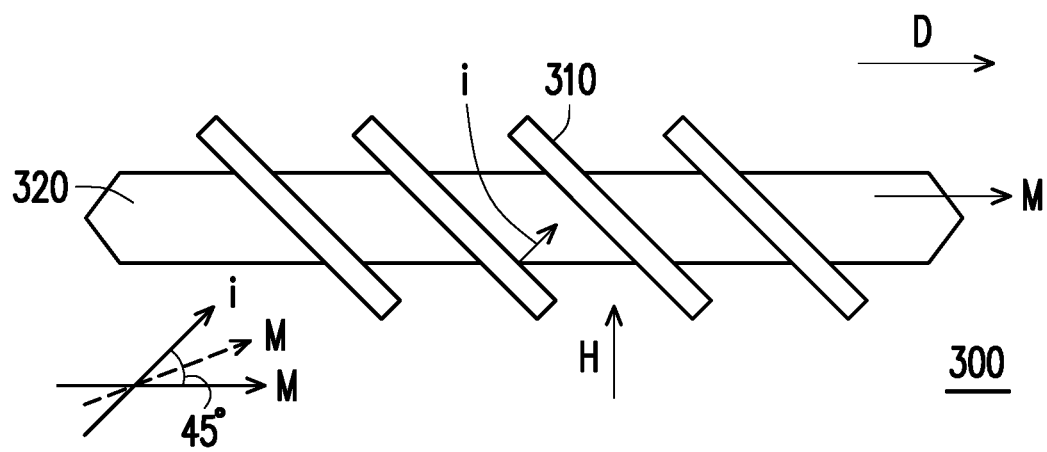

FIG. 3A and FIG. 3B illustrate an operation principle of the anisotropic magnetoresistors in FIG. 1A. Referring to FIG. 3A first, an anisotropic magnetoresistor 300 has a barber-pole shaped structure; that is, there are a plurality of electrical shorting bars 310 on a surface thereof extending and inclining at a tilting angle of 45 degrees relative to an extension direction D of the anisotropic magnetoresistor 300. The electrical shorting bars 310 are disposed at an interval and parallel to each other on a ferromagnetic film 320, and the ferromagnetic film 320 is a main body of the anisotropic magnetoresistor 300 and has an extension direction that is the extension direction D of the anisotropic magnetoresistor 300. Moreover, two opposite ends of the ferromagnetic film 320 may be made into a pointed shape.

Before the anisotropic magnetoresistor 300 starts to measure an external magnetic field H, a magnetization direction of the anisotropic magnetoresistor 300 is set by the magnetization direction setting device 130. Herein, the magnetization direction setting device 130 is, for example, a coil, a conductive wire, a metal sheet, or a conductor that generates a magnetic field through being applied an electric current. In FIG. 3A, the magnetization direction setting device 130 generates a magnetic field in the extension direction D through passage of electric current, such that the anisotropic magnetoresistor 300 has a magnetization direction M.

Next, the magnetization direction setting device 130 is not supplied with electric current so as to allow the anisotropic magnetoresistor 300 to start measuring the external magnetic field H. When there is no external magnetic field H, the magnetization direction M of the anisotropic magnetoresistor 300 remains in the extension direction D. At this time, an electric current i is applied, such that the electric current i flows from a left end to a right end of the anisotropic magnetoresistor 300, and a flowing direction of the electric current i near the electrical shorting bars 310 is perpendicular to the extension direction of the electrical shorting bars 310. This causes the flowing direction of the electric current i near the electrical shorting bars 310 to have an included angle of 45 degrees with the magnetization direction M, and a resistance of the anisotropic magnetoresistor 300 is R at this time.

When there is an external magnetic field H towards a direction perpendicular to the extension direction D, the magnetization direction M of the anisotropic magnetoresistor 300 is deflected towards a direction of the external magnetic field H, which causes the included angle between the magnetization direction and the flowing direction of the electric current i near the electrical shorting bars 310 to be greater than 45 degrees. At this time, the resistance of the anisotropic magnetoresistor 300 undergoes a change of $-\Delta R$, i.e., the resistance thereof becomes $R-\Delta R$. In other words, the resistance is decreased, where $\Delta R$ is greater than 0.

Nevertheless, as shown in FIG. 3B, when the extension direction of the electrical shorting bars 310 of FIG. 2B is set to be a direction having an included angle of 90 degrees with the extension direction of the electrical shorting bars 310 of FIG. 2A (at this time, the extension direction of the electrical shorting bars 310 of FIG. 2B still has an included angle of 45 degrees with the extension direction D of the anisotropic magnetoresistor 300) and when there is an external magnetic field H, the external magnetic field H still causes the magnetization direction M to deflect towards the direction of the external magnetic field H. At this time, the included angle between the magnetization direction M and the flowing direction of the electric current i near the electrical shorting bars 310 is less than 45 degrees, such that the resistance of the anisotropic magnetoresistor 300 becomes $R+\Delta R$. That is, the resistance of the anisotropic magnetoresistor 300 is increased.

Moreover, when the magnetization direction M of the anisotropic magnetoresistor 300 is set by the magnetization direction setting device 130 to be a reverse direction of that shown in FIG. 3A, the resistance of the anisotropic magnetoresistor 300 of FIG. 3A becomes $R+\Delta R$ under the external magnetic field H later. Further, when the magnetization direction M of the anisotropic magnetoresistor 300 is set by the magnetization direction setting device 130 to be a reverse direction of that shown in FIG. 3B, the resistance of the anisotropic magnetoresistor 300 of FIG. 2B becomes $R-\Delta R$ under the external magnetic field H later.

In summary of the above, it is known that when a configuration direction of the electrical shorting bars 310 is changed, the change in the resistance R of the anisotropic magnetoresistor 300 corresponding to the external magnetic field H changes from +ΔR to −ΔR or from −ΔR to +ΔR. Moreover, when the magnetization direction M set by the magnetization direction setting device 130 is reversed, the change in the resistance R of the anisotropic magnetoresistor 300 corresponding to the external magnetic field H changes from +ΔR to −ΔR or from −ΔR to +ΔR. When the direction of the external magnetic field H is reversed, the change in the resistance R of the anisotropic magnetoresistor 300 corresponding to the external magnetic field H changes from +ΔR to −ΔR or from −ΔR to +ΔR. However, when the flowing direction of the electric current i passing the anisotropic magnetoresistor 300 is reversed, the change in the resistance R of the anisotropic magnetoresistor 300 corresponding to the external magnetic field H retains the original plus or minus sign. That is, if the change is originally +ΔR, it remains +ΔR after the flowing direction of the electric current is changed, and if the change is originally −ΔR, it remains −ΔR after the flowing direction of the electric current is changed.

According to the principle above, the variation tendency of the resistance R of the anisotropic magnetoresistor 300, i.e., an increase or decrease in the resistance R (e.g., a change is +ΔR or −ΔR), at the time when the anisotropic magnetoresistor 300 is subject to a component of the external magnetic field H, can be determined through designing the extension direction D of the electrical shorting bars 310 or the magnetization direction M set by the magnetization direction setting device 130.

With reference to FIG. 1A to FIG. 1C, FIG. 2A, and FIG. 2B, the magnetic field sensing device 100 further includes a substrate 150 and an insulating layer 170 disposed on the substrate 150. The substrate 150 is, for example, a semiconductor substrate, a glass substrate, or a circuit substrate. The insulating layer 170 has a plurality of slope surfaces S1, S2, S3, and S4, where the first magnetoresistor units 110 and the second magnetoresistor units 120 are disposed on the slope surfaces S1, S2, S3, and S4. For instance, the anisotropic magnetoresistors A1 and A2 are disposed on the slope surface S1, the anisotropic magnetoresistors B1 and B2 are disposed on the slope surface S2, the anisotropic magnetoresistors C1 and C2 are disposed on the slope surface S3, and the anisotropic magnetoresistors D1 and D2 are disposed on the slope surface S4. In this embodiment, the first direction X1, the second direction X2, and the third direction X3 are perpendicular to one another. In addition, in this embodiment, the anisotropic magnetoresistors A1, A2, B1, and B2 of each of the first magnetoresistor units 110 extend in the second direction X2, and the anisotropic magnetoresistors C1, C2, D1, and D2 of each of the second magnetoresistor units 120 extend in the first direction X1.

In this embodiment, the sensing axes R1 of the anisotropic magnetoresistors A1 and A2 are perpendicular to extension directions of the anisotropic magnetoresistors A1 and A2 and are parallel to the slope surface S1. The sensing axes R1 of the anisotropic magnetoresistors B1 and B2 are perpendicular to extension directions of the anisotropic magnetoresistors B1 and B2 and are parallel to the slope surface S2. The sensing axes R2 of the anisotropic magnetoresistors C1 and C2 are perpendicular to extension directions of the anisotropic magnetoresistors C1 and C2 and are parallel to the slope surface S3. The sensing axes R2 of the anisotropic magnetoresistors D1 and D2 are perpendicular to extension directions of the anisotropic magnetoresistors D1 and D2 and are parallel to the slope surface S4. In this embodiment, the extension direction of the electrical shorting bars 310 of the anisotropic magnetoresistors A1 and A2 is inclined at a tilting angle of 45 degrees relative to the extension directions of the anisotropic magnetoresistors A1 and A2 and is parallel to the slope surface S1. The extension direction of the electrical shorting bars 310 of the anisotropic magnetoresistors B1 and B2 is inclined at a tilting angle of 45 degrees relative to the extension directions of the anisotropic magnetoresistors B1 and B2 and is parallel to the slope surface S2. The extension direction of the electrical shorting bars 310 of the anisotropic magnetoresistors C1 and C2 is inclined at a tilting angle of 45 degrees relative to the extension directions of the anisotropic magnetoresistors C1 and C2 and is parallel to the slope surface S3. The extension direction of the electrical shorting bars 310 of the anisotropic magnetoresistors D1 and D2 is inclined at a tilting angle of 45 degrees relative to the extension directions of the anisotropic magnetoresistors D1 and D2 and is parallel to the slope surface S4. In addition, a top view of tilting directions of the electrical shorting bars 310 of the anisotropic magnetoresistors A1, A2, B1, B2, C1, C2, D1, and D2 is as shown in FIG. 1A.

In this embodiment, a part of the magnetization direction setting devices 130 (e.g., the magnetization direction setting devices 132 and 134) are disposed between the first magnetoresistor units 110 and the substrate 150, and the other part of the magnetization direction setting devices 130 (e.g., the magnetization direction setting devices 136 and 138) are disposed between the second magnetoresistor units 120 and the substrate 150, as shown in FIG. 1A, FIG. 2A, and FIG. 2B. To be specific, in this embodiment, the magnetic field sensing device 100 further includes an insulating layer 180, the magnetization direction setting devices 130 are disposed on the substrate 150, and the insulating layer 180 covers the magnetization direction setting devices 130. The insulating layer 170 is disposed on the insulating layer 180, and the first magnetoresistor units 110 and the second magnetoresistor units 120 are disposed on the insulating layer 170.

Figure 4:
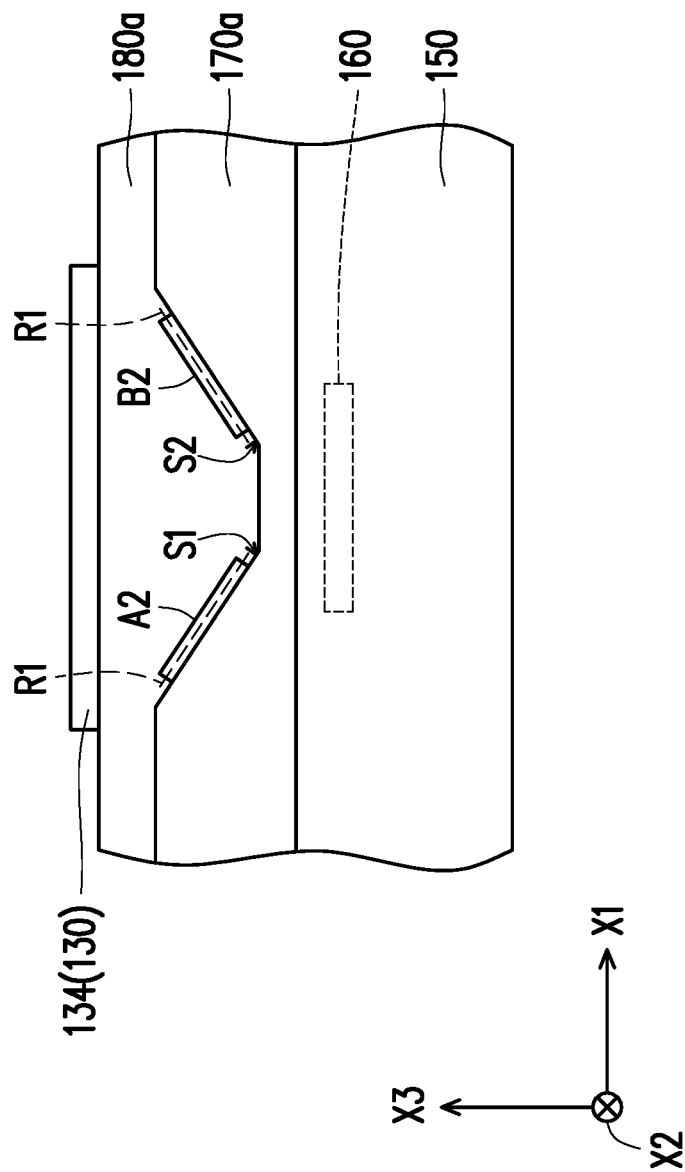
FIG. 4 is another form of the magnetic field sensing device in FIG. 2A.

Nevertheless, in another embodiment, the first magnetoresistor units 110 are disposed between a part of the magnetization direction setting devices 130 (e.g., the magnetization direction setting devices 132 and 134) and the substrate 150, and the second magnetoresistor units 120 are disposed between the other part of the magnetization direction setting devices 130 (e.g., the magnetization direction setting devices 136 and 138) and the substrate 150, as shown in FIG. 1A and FIG. 4. To be specific, in this embodiment, an insulating layer 170a is disposed on the substrate 150, and the first magnetoresistor units 110 and the second magnetoresistor units 120 are disposed on the insulating layer 170a. An insulating layer 180a is disposed on the insulating layer 170a and covers the first magnetoresistor units 110 and the second magnetoresistor units 120. In addition, the magnetization direction setting devices 130 are disposed on the insulating layer 180a. Nevertheless, in other embodiments, a part of the magnetization direction setting devices 130 may be disposed above the first magnetoresistor units 110 or the second magnetoresistor units 120, and another part of the magnetization direction setting devices 130 may be disposed below the first magnetoresistor units 110 or the second magnetoresistor units 120.

In this embodiment, the first magnetoresistor units 110 and the second magnetoresistor units 120 are electrically connected to form a plurality of different kinds of Wheatstone bridges (e.g., the three kinds of Wheatstone bridges depicted in FIG. 1A, FIG. 1B, and FIG. 1C) in different time periods, respectively, so as to measure a plurality of magnetic field components in a plurality of directions in the three-dimensional space, respectively.

For instance, the different kinds of Wheatstone bridges measure magnetic field components H4, H5, and H3 in a fourth direction X4, a fifth direction X5, and the third direction X3 in three different time periods, respectively (as shown in FIG. 1A, FIG. 1B, and FIG. 1C, respectively), and output three signals corresponding to the magnetic field components H4, H5, and H3 in the fourth direction X4, the fifth direction X5, and the third direction X3, respectively. Herein, the first direction X1, the second direction X2, the third direction X3, the fourth direction X4, and the fifth direction X5 are different from one another. The fourth direction X4 is a sum vector direction of the first direction X1 and the second direction X2, and the fifth direction X5 is a difference vector direction of the first direction X1 and the second direction X2. In this embodiment, the first direction X1, the second direction X2, and the third direction X3 are perpendicular to one another. Moreover, the fourth direction X4 is perpendicular to the fifth direction X5, and the fourth direction X4 has an included angle of 45 degrees with both the first direction X1 and the second direction X2.

In this embodiment, in any one of the three different time periods, the signal outputted by the different kinds of Wheatstone bridges is a differential signal corresponding to a magnetic field component H4, H5, or H3 in one of the fourth direction X4, the fifth direction X5, and the third direction X3. At this time, differential signals generated by the different kinds of Wheatstone bridges and corresponding to magnetic field components in directions other than the one of the fourth direction X4, the fifth direction X5, and the third direction X3 are zero.

In this embodiment, each of the first magnetoresistor units 110 includes a plurality of first magnetoresistors (i.e., the anisotropic magnetoresistors). For instance, in FIG. 1A, the first magnetoresistor unit 110 on the left includes the anisotropic magnetoresistor A1 and the anisotropic magnetoresistor A2 (i.e., the first magnetoresistors). In FIG. 1A, the first magnetoresistor unit 110 on the right includes the anisotropic magnetoresistor B1 and the anisotropic magnetoresistor B2 (i.e., the first magnetoresistors). A part (e.g., the anisotropic magnetoresistor A1) and the other part (e.g., the anisotropic magnetoresistor A2) among the anisotropic magnetoresistors A1 and A2 are set to have opposite magnetization directions, respectively. For instance, in FIG. 1A, a magnetization direction M1 of the anisotropic magnetoresistor A1 is towards an inverse direction of the second direction X2, and a magnetization direction M2 of the anisotropic magnetoresistor A2 is towards the second direction X2. In addition, a part (e.g., the anisotropic magnetoresistor B1) and the other part (e.g., the anisotropic magnetoresistor B2) among the anisotropic magnetoresistors B1 and B2 are set to have opposite magnetization directions, respectively. For instance, in FIG. 1A, a magnetization direction M3 of the anisotropic magnetoresistor B1 is towards the inverse direction of the second direction X2, and a magnetization direction M4 of the anisotropic magnetoresistor B2 is towards the second direction X2.

Each of the second magnetoresistor units 120 includes a plurality of second magnetoresistors (i.e., the anisotropic magnetoresistors). For instance, in FIG. 1A, the second magnetoresistor unit 120 on the top includes the anisotropic magnetoresistor C1 and the anisotropic magnetoresistor C2 (i.e., the second magnetoresistors). In FIG. 1A, the second magnetoresistor unit 120 at the bottom includes the anisotropic magnetoresistor D1 and the anisotropic magnetoresistor D2 (i.e., the second magnetoresistors). A part (e.g., the anisotropic magnetoresistor C1) and the other part (e.g., the anisotropic magnetoresistor C2) among the anisotropic magnetoresistors C1 and C2 are set to have opposite magnetization directions, respectively. For instance, in FIG. 1A, a magnetization direction M5 of the anisotropic magnetoresistor C1 is towards the first direction X1, and a magnetization direction M6 of the anisotropic magnetoresistor C2 is towards an inverse direction of the first direction X1. In addition, a part (e.g., the anisotropic magnetoresistor D1) and the other part (e.g., the anisotropic magnetoresistor D2) among the anisotropic magnetoresistors D1 and D2 are set to have opposite magnetization directions, respectively. For instance, in FIG. 1A, a magnetization direction M7 of the anisotropic magnetoresistor D1 is towards the first direction X1, and a magnetization direction M8 of the anisotropic magnetoresistor D2 is towards the inverse direction of the first direction X1.

In this embodiment, the magnetic field sensing device 100 further includes a switching circuit 160 (as shown in FIG. 2A and FIG. 2B) electrically connecting the first magnetoresistor units 110 and the second magnetoresistor units 120. Herein, the switching circuit 160 electrically connects the first magnetoresistor units 110 and the second magnetoresistor units 120 to form the different kinds of Wheatstone bridges (e.g., the three kinds of Wheatstone bridges as shown in FIG. 1A, FIG. 1B, and FIG. 1C) in the different time periods, respectively. In this embodiment, the first magnetoresistor units 110 and the second magnetoresistor units 120 are electrically connected through the switching circuit 160 to form different kinds of Wheatstone full bridges in the different time periods, respectively. In this embodiment, the switching circuit 160, for example, is a circuit located on the substrate 150 or a circuit in the substrate 150.

An external magnetic field in space may be regarded as being formed by the magnetic field component H4 in the fourth direction X4, the magnetic field component H5 in the fifth direction X5, and the magnetic field component H3 in the third direction X3. The effect generated by the magnetic field component H4 on the first magnetoresistor units 110 and the second magnetoresistor units 120 is as shown in FIG. 1A. To be specific, when no external magnetic field is present, a resistance of each of the anisotropic magnetoresistors A1, A2, B1, B2, C1, C2, D1, and D2 is, for example, R. When the magnetic field component H4 is present, according to the principle of FIG. 3A and FIG. 3B as described above, a change in resistance of each of the anisotropic magnetoresistors A1 and A2 is −ΔR. The first magnetoresistor unit 110 formed by the anisotropic magnetoresistors A1 and A2 thus has a change in resistance of −2ΔR. That is, a resistance of the first magnetoresistor unit 110 formed by the anisotropic magnetoresistors A1 and A2 is changed from the original 2R to 2R−2ΔR. In addition, the magnetic field component H4 causes a change in resistance of each of the anisotropic magnetoresistors B1 and B2 to be +ΔR. The first magnetoresistor unit 110 formed by the anisotropic magnetoresistors B1 and B2 thus has a change in resistance of +2ΔR.

On the other hand, the magnetic field component H4 causes a change in resistance of each of the anisotropic magnetoresistors C1 and C2 to be −ΔR. The second magnetoresistor unit 120 formed by the anisotropic magnetoresistors C1 and C2 thus has a change in resistance of −2ΔR. In addition, the magnetic field component H4 causes a change in resistance of each of the anisotropic magnetoresistors D1 and D2 to be +ΔR. The second magnetoresistor unit 120 formed by the anisotropic magnetoresistors D1 and D2 thus has a change in resistance of +2ΔR.

The effect generated by the magnetic field component H5 on the first magnetoresistor units 110 and the second magnetoresistor units 120 is as shown in FIG. 1B. To be specific, when the magnetic field component H5 is present, according to the principle of FIG. 3A and FIG. 3B as described above, the change in resistance of each of the anisotropic magnetoresistors A1 and A2 is +ΔR. The first magnetoresistor unit 110 formed by the anisotropic magnetoresistors A1 and A2 thus has the change in resistance of +2ΔR. That is, the resistance of the first magnetoresistor unit 110 formed by the anisotropic magnetoresistors A1 and A2 is changed from the original 2R to 2R+2ΔR. In addition, the magnetic field component H5 causes the change in resistance of each of the anisotropic magnetoresistors B1 and B2 to be −ΔR. The first magnetoresistor unit 110 formed by the anisotropic magnetoresistors B1 and B2 thus has the change in resistance of −2ΔR.

On the other hand, the magnetic field component H5 causes the change in resistance of each of the anisotropic magnetoresistors C1 and C2 to be −ΔR. The second magnetoresistor unit 120 formed by the anisotropic magnetoresistors C1 and C2 thus has the change in resistance of −2ΔR. In addition, the magnetic field component H5 causes the change in resistance of each of the anisotropic magnetoresistors D1 and D2 to be +ΔR. The second magnetoresistor unit 120 formed by the anisotropic magnetoresistors D1 and D2 thus has the change in resistance of +2ΔR.

The effect generated by the magnetic field component H3 on the first magnetoresistor units 110 and the second magnetoresistor units 120 is as shown in FIG. 1C. To be specific, when the magnetic field component H3 is present, according to the principle of FIG. 3A and FIG. 3B as described above, the change in resistance of each of the anisotropic magnetoresistors A1 and A2 is +ΔR. The first magnetoresistor unit 110 formed by the anisotropic magnetoresistors A1 and A2 thus has the change in resistance of +2ΔR. That is, the resistance of the first magnetoresistor unit 110 formed by the anisotropic magnetoresistors A1 and A2 is changed from the original 2R to 2R+2ΔR. In addition, the magnetic field component H3 causes the change in resistance of each of the anisotropic magnetoresistors B1 and B2 to be +ΔR. The first magnetoresistor unit 110 formed by the anisotropic magnetoresistors B1 and B2 thus has the change in resistance of +2ΔR.

On the other hand, the magnetic field component H3 causes the change in resistance of each of the anisotropic magnetoresistors C1 and C2 to be −ΔR. The second magnetoresistor unit 120 formed by the anisotropic magnetoresistors C1 and C2 thus has the change in resistance of −2ΔR. In addition, the magnetic field component H3 causes the change in resistance of each of the anisotropic magnetoresistors D1 and D2 to be −ΔR. The second magnetoresistor unit 120 formed by the anisotropic magnetoresistors D1 and D2 thus has the change in resistance of −2ΔR.

In this embodiment, the anisotropic magnetoresistors A1 and A2 are sequentially connected in series between an end point P1 and an end point P2, the anisotropic magnetoresistors B1 and B2 are sequentially connected in series between an end point P3 and an end point P4, the anisotropic magnetoresistors C1 and C2 are sequentially connected in series between an end point P5 and an end point P6, and the anisotropic magnetoresistors D1 and D2 are sequentially connected in series between an end point P7 and an end point P8.

In a first time period of the three different time periods, the switching circuit 160 electrically connects the end point P1 to the end point P7, electrically connects the end point P2 to the end point P4, electrically connects the end point P3 to the end point P5, and electrically connects the end point P6 to the end point P8, so as to form the Wheatstone bridge as shown in FIG. 1A. At this time, a voltage difference may be applied between the end point P6 and the end point P2 (for example, to enable the end point P6 to receive a reference voltage VDD and the end point P2 to be coupled to ground), a voltage difference between the end point P1 and the end point P3 is (VDD)×(−ΔR/R), which may be used as an output signal. This output signal is a differential signal, and its magnitude corresponds to a magnitude of the magnetic field component H4 in the fourth direction X4. At this time, a combination of changes in resistance caused by the magnetic field component H5 on the first magnetoresistor units 110 and the second magnetoresistor units 120 as shown in FIG. 1B and a combination of changes in resistance caused by the magnetic field component H3 on the first magnetoresistor units 110 and the second magnetoresistor units 120 as shown in FIG. 1C make the differential signals outputted by the end point P1 and the end point P3, when connection is made to form the kind of Wheatstone bridge as shown in FIG. 1A, both be zero. Therefore, the kind of Wheatstone bridge depicted in FIG. 1A may be regarded as a circuit configured to measure the magnetic field component H4 but configured not to measure the magnetic field components H5 and H3.

In a second time period of the three different time periods, the switching circuit 160 electrically connects the end point P1 to the end point P5, electrically connects the end point P2 to the end point P4, electrically connects the end point P3 to the end point P7, and electrically connects the end point P6 to the end point P8, so as to form the Wheatstone bridge as shown in FIG. 1B. At this time, a voltage difference may be applied between the end point P6 and the end point P2 (for example, to enable the end point P6 to receive the reference voltage VDD and the end point P2 to be coupled to the ground), and a voltage difference between the end point P1 and the end point P3 is (VDD)×(ΔR/R), which may be used as an output signal. This output signal is a differential signal, and its magnitude corresponds to a magnitude of the magnetic field component H5 in the fifth direction X5. At this time, a combination of changes in resistance caused by the magnetic field component H4 on the first magnetoresistor units 110 and the second magnetoresistor units 120 as shown in FIG. 1A and the combination of changes in resistance caused by the magnetic field component H3 on the first magnetoresistor units 110 and the second magnetoresistor units 120 as shown in FIG. 1C make the differential signals outputted by the end point P1 and the end point P3, when connection is made to form the kind of Wheatstone bridge as shown in FIG. 1B, both be zero. Therefore, the kind of Wheatstone bridge depicted in FIG. 1B may be regarded as a circuit configured to measure the magnetic field component H5 but configured not to measure the magnetic field components H4 and H3.

In a third time period of the three different time periods, the switching circuit 160 electrically connects the end point P1 to the end point P5, electrically connects the end point P2 to the end point P7, electrically connects the end point P3 to the end point P8, and electrically connects the end point P4 to the end point P6, so as to form the Wheatstone bridge as shown in FIG. 1C. At this time, a voltage difference may be applied between the end point P6 and the end point P2 (for example, to enable the end point P6 to receive the reference voltage VDD and the end point P2 to be coupled to the ground), and a voltage difference between the end point P1 and the end point P3 is (VDD)×(ΔR/R), which may be used as an output signal. This output signal is a differential signal, and its magnitude corresponds to a magnitude of the magnetic field component H3 in the third direction X3. At this time, a combination of changes in resistance caused by the magnetic field component H4 on the first magnetoresistor units 110 and the second magnetoresistor units 120 as shown in FIG. 1A and a combination of changes in resistance caused by the magnetic field component H5 on the first magnetoresistor units 110 and the second magnetoresistor units 120 as shown in FIG. 1B make the differential signals outputted by the end point P1 and the end point P3, when connection is made to form the kind of Wheatstone bridge as shown in FIG. 1C, both be zero. Therefore, the kind of Wheatstone bridge depicted in FIG. 1C may be regarded as a circuit configured to measure the magnetic field component H3 but configured not to measure the magnetic field components H4 and H5.

When the first time period, the second time period, and the third time period are repeated in turn, the magnetic field sensing device 100 may measure the magnetic field component H4 in the fourth direction X4, the magnetic field component H5 in the fifth direction X5, and the magnetic field component H3 in the third direction X3 by turns, and the external magnetic field may thus be measured in real time. In addition, through an operation of a rotational matrix, the magnetic field component H4 in the fourth direction X4 and the magnetic field component H5 in the fifth direction X5 may be converted into a magnetic field component in the first direction X1 and a magnetic field component in the second direction X2. Further, the external magnetic field may also be calculated through the magnetic field component in the first direction X1, the magnetic field component in the second direction X2, and the magnetic field component H3 in the third direction X3. The operation of the rotational matrix may be performed through an operation circuit or a processor located on or in the substrate 150 and may be performed through an operation circuit or a processor outside the substrate 150.

Figure 5A:
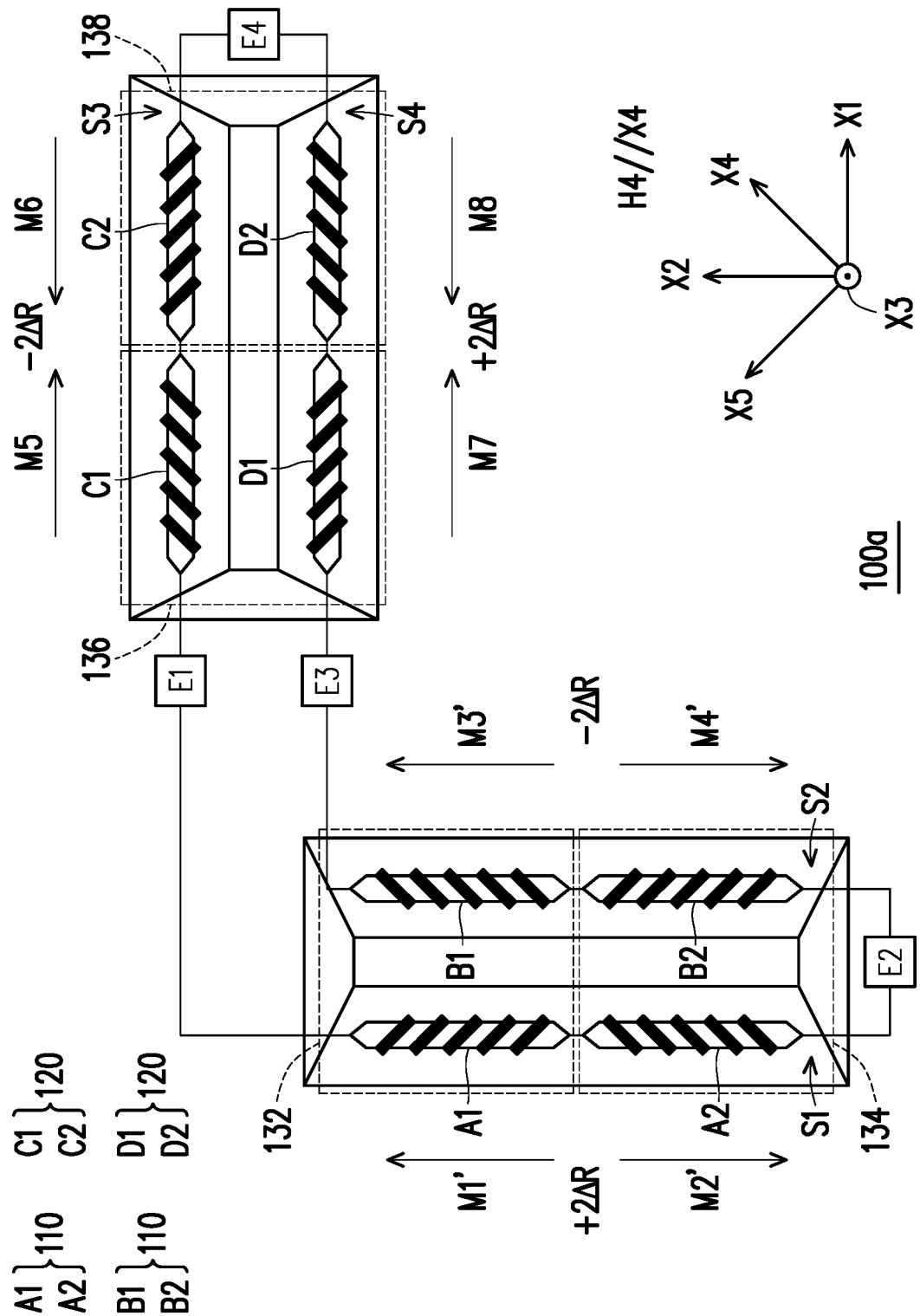
FIG. 5A, FIG. 5B, and FIG. 5C are schematic top views of a magnetic field sensing device according to another embodiment of the invention and respectively illustrate parameter changes caused by magnetic field components of an external magnetic field in the fourth direction, the fifth direction, and the third direction.
Figure 5B:
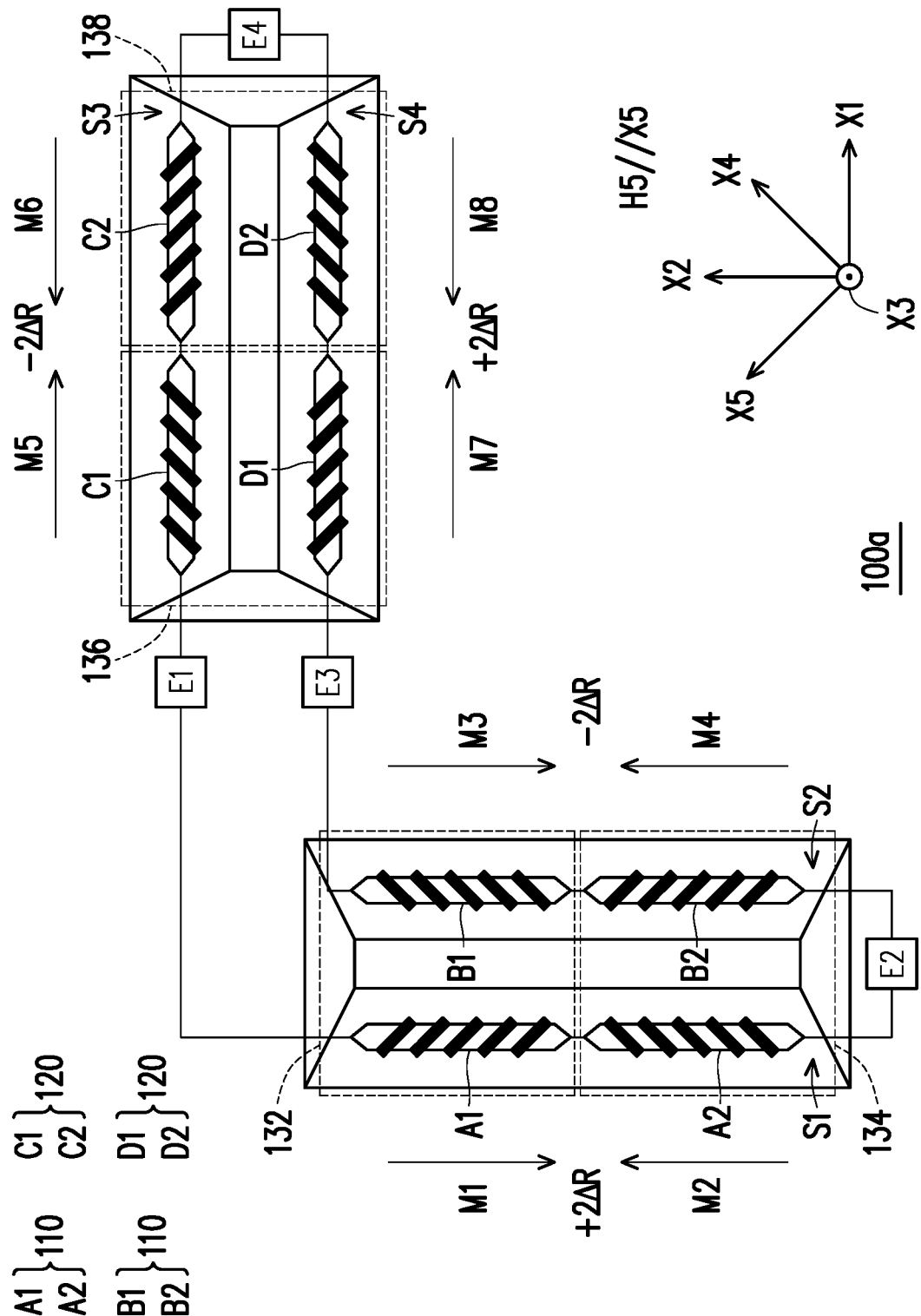
Figure 5C:
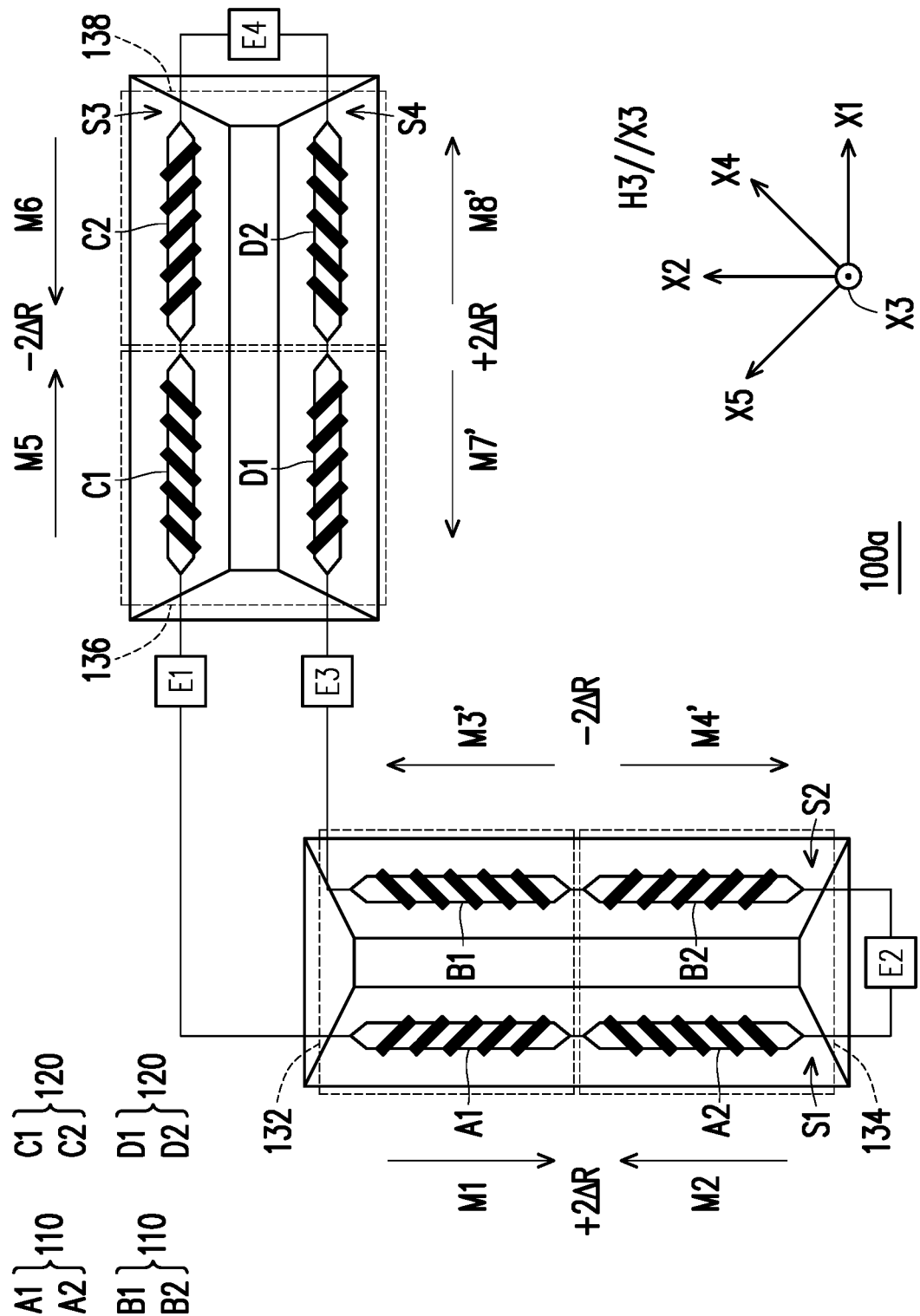

FIG. 5A, FIG. 5B, and FIG. 5C are schematic top views of a magnetic field sensing device according to another embodiment of the invention and respectively illustrate parameter changes caused by magnetic field components of an external magnetic field in the fourth direction, the fifth direction, and the third direction. With reference to FIG. 5A, FIG. 5B, and FIG. 5C, a magnetic field sensing device 100a of this embodiment is similar to the magnetic field sensing device 100 of FIG. 1A to FIG. 1C, and a difference therebetween is provided as follows. In the magnetic field sensing device 100a of this embodiment, the first magnetoresistor units 110 and the second magnetoresistor units 120 are electrically connected to form one kind of Wheatstone bridge (e.g., FIG. 5A, FIG. 5B, and FIG. 5C illustrates the same kind of Wheatstone full bridge) in a plurality of different time periods. Nevertheless, the first magnetoresistor units 110 and the second magnetoresistor units 120 connected by the one kind of Wheatstone bridge are switched into a plurality of different magnetization direction combinations in the different time periods, respectively, so as to respectively measure a plurality of magnetic field components in a plurality of directions in the three-dimensional space.

In this embodiment, the one kind of Wheatstone bridge measures the magnetic field components H4, H5, and H3 respectively in the fourth direction X4, the fifth direction X5, and the third direction X3 in three different time periods, respectively (as shown in FIG. 5A, FIG. 5B, and FIG. 5C, respectively), and outputs three signals respectively corresponding to the magnetic field components H4, H5, and H3 in the fourth direction X4, the fifth direction X5, and the third direction X3. In addition, in any one of the three different time periods, the signal outputted by the one kind of Wheatstone bridge is a differential signal corresponding to the magnetic field component H4, H5, or H3 in one of the fourth direction X4, the fifth direction X5, and the third direction X3. At this time, differential signals generated by the one kind of Wheatstone bridge and corresponding to magnetic field components in directions other than the one of the fourth direction X4, the fifth direction X5, and the third direction X3 are zero.

In this embodiment, the anisotropic magnetoresistors A1 and A2 are connected in series between a junction point E1 and a junction point E2, the anisotropic magnetoresistors B1 and B2 are connected in series between a junction point E3 and the junction point E2, the anisotropic magnetoresistors C1 and C2 are connected in series between a junction point E4 and the junction point E1, and the anisotropic magnetoresistors D1 and D2 are connected in series between a junction point D1 and a junction point D2.

In a first time period of the three different time periods, the magnetization direction setting device 132 presets a magnetization direction M1' of the anisotropic magnetoresistor A1 and a magnetization direction M3' of the anisotropic magnetoresistor B1 to be towards the second direction X2. The magnetization direction setting device 134 presets a magnetization direction MT of the anisotropic magnetoresistor A2 and a magnetization direction M4' of the anisotropic magnetoresistor B2 to be towards the inverse direction of the second direction X2. The magnetization direction setting device 136 presets a magnetization direction M5 of the anisotropic magnetoresistor C1 and a magnetization direction M7 of the anisotropic magnetoresistor D1 to be towards the first direction X1. Moreover, the magnetization direction setting device 138 presets a magnetization direction M6 of the anisotropic magnetoresistor C2 and a magnetization direction M8 of the anisotropic magnetoresistor D2 to be towards the inverse direction of the first direction X1, as shown in FIG. 5A.

At this time, the magnetic field component H4 enables the first magnetoresistor unit 110 formed by the anisotropic magnetoresistors A1 and A2 to generate a change in resistance of $+2\Delta R$, enables the first magnetoresistor unit 110 formed by the anisotropic magnetoresistors B1 and B2 to generate a change in resistance of $-2\Delta R$, enable the second magnetoresistor unit 120 formed by the anisotropic magnetoresistors C1 and C2 to generate a change in resistance of $-2\Delta R$, and enable the second magnetoresistor unit 120 formed by the anisotropic magnetoresistors D1 and D2 to generate a change in resistance of $+2\Delta R$. At this time, a voltage difference may be applied between the junction point E4 and the junction point E2 (for example, to enable the junction point E4 to receive the reference voltage VDD and the junction point E2 to be coupled to the ground), and a voltage difference between the junction point E1 and the junction point E2 is $(VDD) \times (\Delta R/R)$, which may be used as an output signal. This output signal is a differential signal, and its magnitude corresponds to the magnitude of the magnetic field component H4 in the fourth direction X4. At this time, based on a combination of the magnetization directions M1', M2', M3', M4', M5, M6, M7, and M8 as shown in FIG. 5A, a combination of changes in resistance caused by the magnetic field component H5 on the first magnetoresistor units 110 and the second magnetoresistor units 120 and a combination of changes in resistance caused by the magnetic field component H3 on the first magnetoresistor units 110 and the second magnetoresistor units 120 both make contributions of zero to the differential signal outputted by the junction point E1 and the junction point E3. Therefore, the combination of the magnetization directions M1', M2', M3', M4', M5, M6, M7, and M8 depicted in FIG. 5A may be regarded as a combination configured to measure the magnetic field component H4 but configured not to measure the magnetic field components H5 and H3.

In a second time period of the three different time periods, the magnetization direction setting device 132 presets the magnetization direction M1 of the anisotropic magnetoresistor A1 and the magnetization direction M3 of the anisotropic magnetoresistor B1 to be towards the inverse direction of the second direction X2. The magnetization direction setting device 134 presets the magnetization direction M2 of the anisotropic magnetoresistor A2 and the magnetization direction M4 of the anisotropic magnetoresistor B2 to be towards the second direction X2. The magnetization direction setting device 136 presets the magnetization direction M5 of the anisotropic magnetoresistor C1 and the magnetization direction M7 of the anisotropic magnetoresistor D1 to be towards the first direction X1. Moreover, the magnetization direction setting device 138 presets the magnetization direction M6 of the anisotropic magnetoresistor C2 and the magnetization direction M8 of the anisotropic magnetoresistor D2 to be towards the inverse direction of the first direction X1, as shown in FIG. 5B.

At this time, the magnetic field component H5 enables the first magnetoresistor unit 110 formed by the anisotropic magnetoresistors A1 and A2 to generate a change in resistance of +2ΔR, enables the first magnetoresistor unit 110 formed by the anisotropic magnetoresistors B1 and B2 to generate a change in resistance of −2ΔR, enables the second magnetoresistor unit 120 formed by the anisotropic magnetoresistors C1 and C2 to generate a change in resistance of −2ΔR, and enables the second magnetoresistor unit 120 formed by the anisotropic magnetoresistors D1 and D2 to generate a change in resistance of +2ΔR. At this time, a voltage difference may be applied between the junction point E4 and the junction point E2 (for example, to enable the junction point E4 to receive the reference voltage VDD and the junction point E2 to be coupled to the ground), and a voltage difference between the junction point E1 and the junction point E2 is (VDD)×(ΔR/R), which may be used as an output signal. This output signal is a differential signal, and its magnitude corresponds to the magnitude of the magnetic field component H5 in the fifth direction X5. At this time, based on a combination of the magnetization directions M1, M2, M3, M4, M5, M6, M7, and M8 as shown in FIG. 5B, a combination of changes in resistance caused by the magnetic field component H4 on the first magnetoresistor units 110 and the second magnetoresistor units 120 and the combination of changes in resistance caused by the magnetic field component H3 on the first magnetoresistor units 110 and the second magnetoresistor units 120 both make contributions of zero to the differential signal outputted by the junction point E1 and the junction point E3. Therefore, the combination of the magnetization directions M1, M2, M3, M4, M5, M6, M7, and M8 depicted in FIG. 5B may be regarded as a combination configured to measure the magnetic field component H5 but configured not to measure the magnetic field components H4 and H3.

In a third time period of the three different time periods, the magnetization direction setting device 132 presets the magnetization direction M1 of the anisotropic magnetoresistor A1 to be towards the inverse direction of the second direction and presets the magnetization direction M3' of the anisotropic magnetoresistor B1 to be towards the second direction X2. The magnetization direction setting device 134 presets the magnetization direction M2 of the anisotropic magnetoresistor A2 to be towards the second direction X2 and presets the magnetization direction M4' of the anisotropic magnetoresistor B2 to be towards the inverse direction of the second direction X2. The magnetization direction setting device 136 presets the magnetization direction M5 of the anisotropic magnetoresistor C1 to be towards the first direction X1 and presets the magnetization direction M7' of the anisotropic magnetoresistor D1 to be towards the inverse direction of the first direction X1. Moreover, the magnetization direction setting device 138 presets the magnetization direction M6 of the anisotropic magnetoresistor C2 to be towards the inverse direction of the first direction X1 and presets the magnetization direction M8' of the anisotropic magnetoresistor D2 to be towards the first direction X1, as shown in FIG. 5C.

At this time, the magnetic field component H3 enables the first magnetoresistor unit 110 formed by the anisotropic magnetoresistors A1 and A2 to generate a change in resistance of +2ΔR, enables the first magnetoresistor unit 110 formed by the anisotropic magnetoresistors B1 and B2 to generate a change in resistance of −2ΔR, enables the second magnetoresistor unit 120 formed by the anisotropic magnetoresistors C1 and C2 to generate a change in resistance of −2ΔR, and enables the second magnetoresistor unit 120 formed by the anisotropic magnetoresistors D1 and D2 to generate a change in resistance of +2ΔR. At this time, a voltage difference may be applied between the junction point E4 and the junction point E2 (for example, to enable the junction point E4 to receive the reference voltage VDD and the junction point E2 to be coupled to the ground), and a voltage difference between the junction point E1 and the junction point E2 is (VDD)×(ΔR/R), which may be used as an output signal. This output signal is a differential signal, and its magnitude corresponds to the magnitude of the magnetic field component H3 in the third direction X3. At this time, based on a combination of the magnetization directions M1, M2, M3', M4', M5, M6, M7', and M8' as shown in FIG. 5C, the combination of changes in resistance caused by the magnetic field component H4 on the first magnetoresistor units 110 and the second magnetoresistor units 120 and a combination of changes in resistance caused by the magnetic field component H5 on the first magnetoresistor units 110 and the second magnetoresistor units 120 both make contributions of zero to the differential signal outputted by the junction point E1 and the junction point E3. Therefore, the combination of the magnetization directions M1, M2, M3', M4', M5, M6, M7', and M8' depicted in FIG. 5C may be regarded as a combination configured to measure the magnetic field component H3 but configured not to measure the magnetic field components H4 and H5.

When the first time period, the second time period, and the third time period are repeated in turn, the magnetic field sensing device 100a may measure the magnetic field component H4 in the fourth direction X4, the magnetic field component H5 in the fifth direction X5, and the magnetic field component H3 in the third direction X3 by turns, and the external magnetic field may thus be measured in real time. In addition, through an operation of a rotational matrix, the magnetic field component H4 in the fourth direction X4 and the magnetic field component H5 in the fifth direction X5 may be converted into the magnetic field component in the first direction X1 and the magnetic field component in the second direction X2. Further, the external magnetic field may also be calculated through the magnetic field component in the first direction X1, the magnetic field component in the second direction X2, and the magnetic field component H3 in the third direction X3.

Figure 6A:
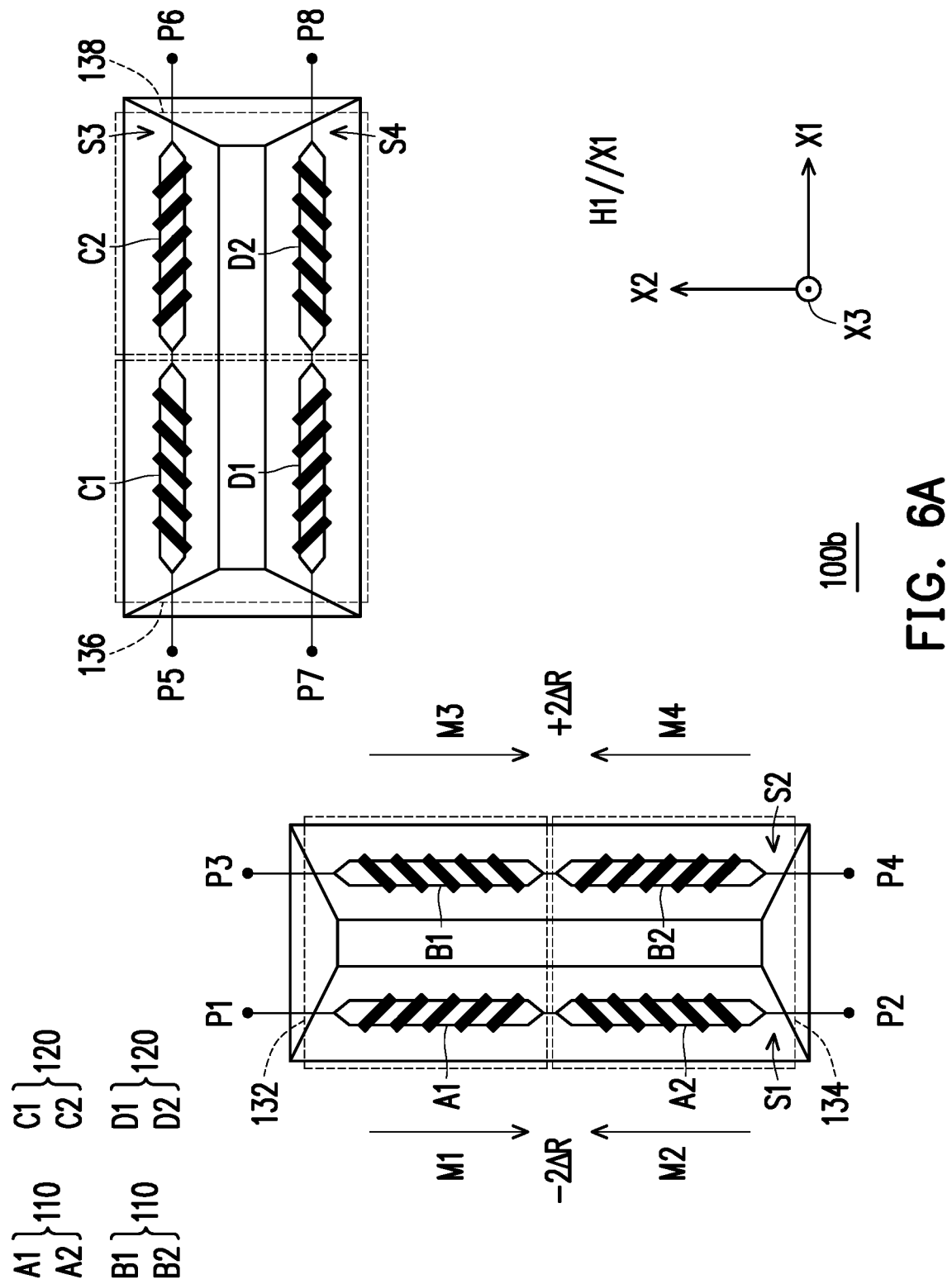
FIG. 6A, FIG. 6B, and FIG. 6C are schematic top views of a magnetic field sensing device according to still another embodiment of the invention and respectively illustrate parameter changes caused by magnetic field components of an external magnetic field in the first direction, the second direction, and the third direction.
Figure 6B:
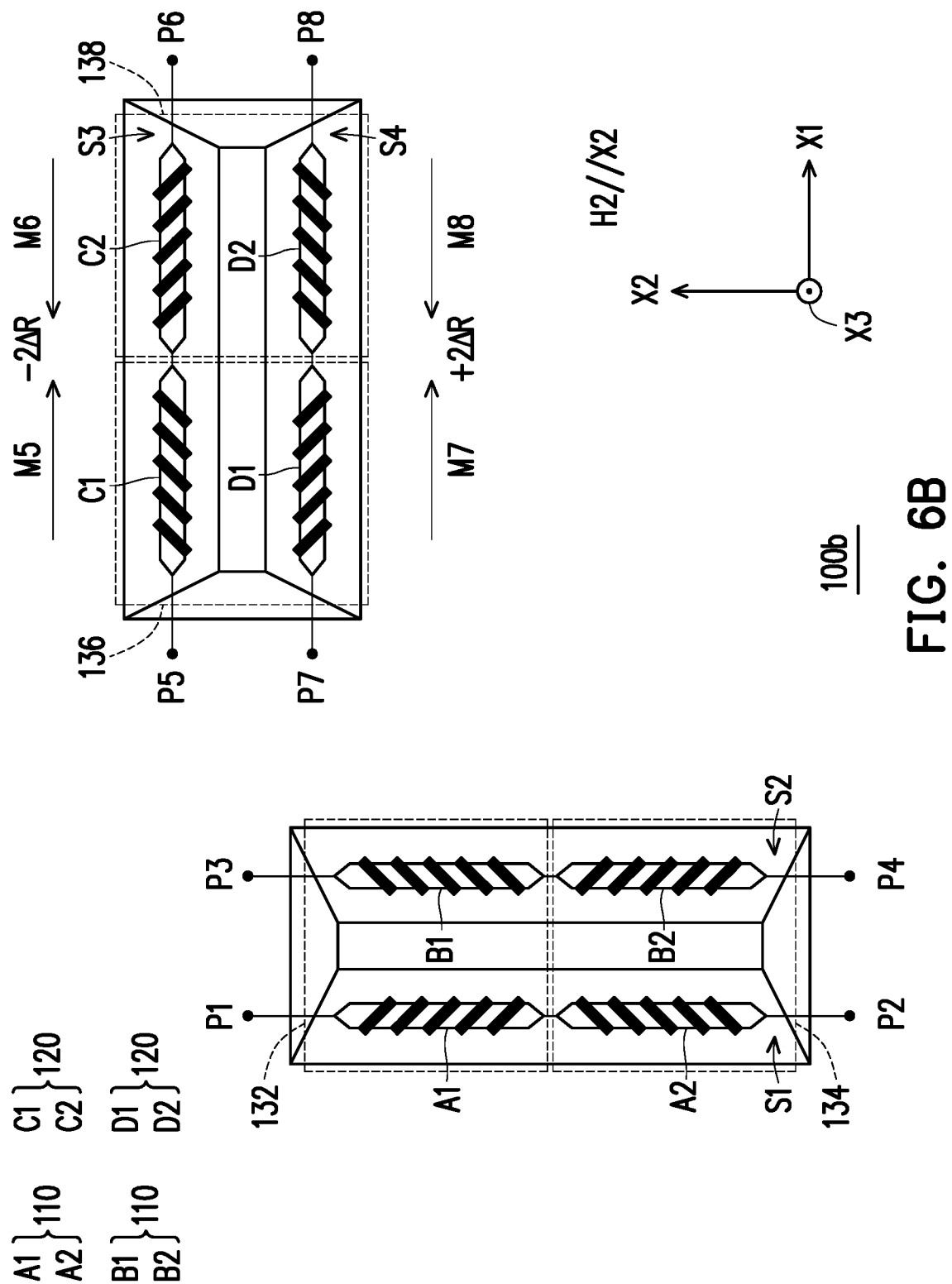
Figure 6C:
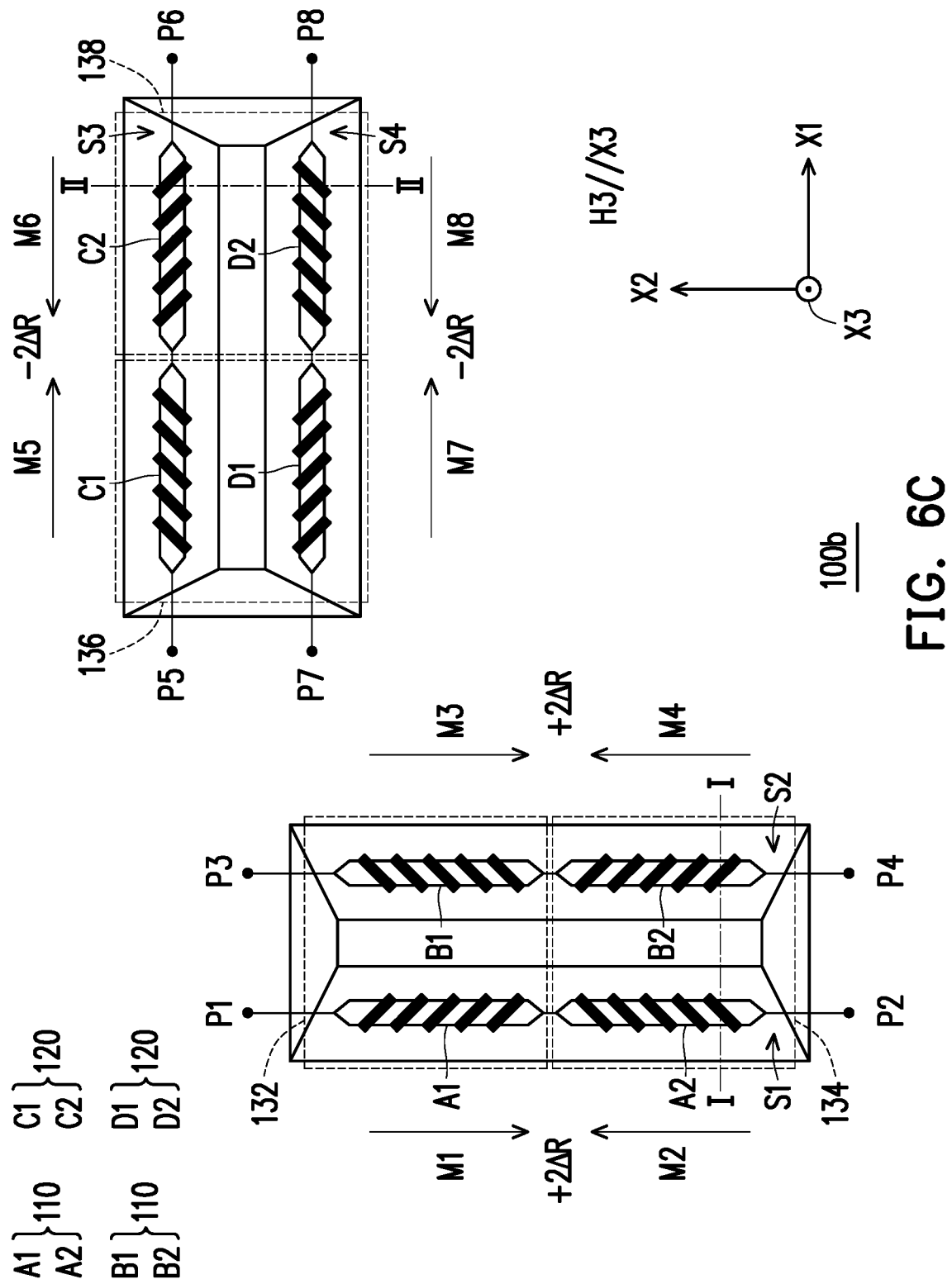

FIG. 6A, FIG. 6B, and FIG. 6C are schematic top views of a magnetic field sensing device according to still another embodiment of the invention and respectively illustrate parameter changes caused by magnetic field components of an external magnetic field in the first direction, the second direction, and the third direction. With reference to FIG. 6A, FIG. 6B, and FIG. 6C, a magnetic field sensing device 100*b* of this embodiment is similar to the magnetic field sensing device 100 of FIG. 1A to FIG. 1C, and a difference therebetween is provided as follows. In a first time period of the three different time periods, as shown in FIG. 6A, the end points P5 to P8 are not electrically connected, so no signal is outputted by the second magnetoresistor units 120. The end point P1 is electrically connected to the end point P3, the end point P2 receives the reference voltage VDD, and the end point P4 is connected to the ground to form a Wheatstone half bridge. At this time, a voltage of the end point P1 may be used as an output signal corresponding to the magnetic field component H1 in the first direction X1.

In a second time period of the three different time periods, as shown in FIG. 6B, the end points P1 to P4 are not electrically connected, so no signal is outputted by the first magnetoresistor units 110. The end point P5 is electrically connected to the end point P7, the end point P6 receives the reference voltage VDD, and the end point P8 is connected to the ground to form a Wheatstone half bridge. At this time, a voltage of the end point P5 may be used as an output signal corresponding to the magnetic field component in the second direction X2.

Further, in a third time period of the three time periods, as shown in FIG. 6C, similar to the connection manner shown in FIG. 1C, the end point P1 is electrically connected to the end point P5, the end point P2 is electrically connected to the end point P7, the end point P3 is electrically connected to the end point P8, and the end point P4 is electrically connected to the end point P6. Moreover, the end point P6 receives the reference voltage VDD, and the end point P2 is coupled to the ground. In this way, a voltage difference between the end point P1 and the end point P3 is (VDD)×(ΔR/R), which may be used as an output signal. This output signal is a differential signal, and its magnitude corresponds to the magnitude of the magnetic field component H3 in the third direction X3.

Figure 7A:
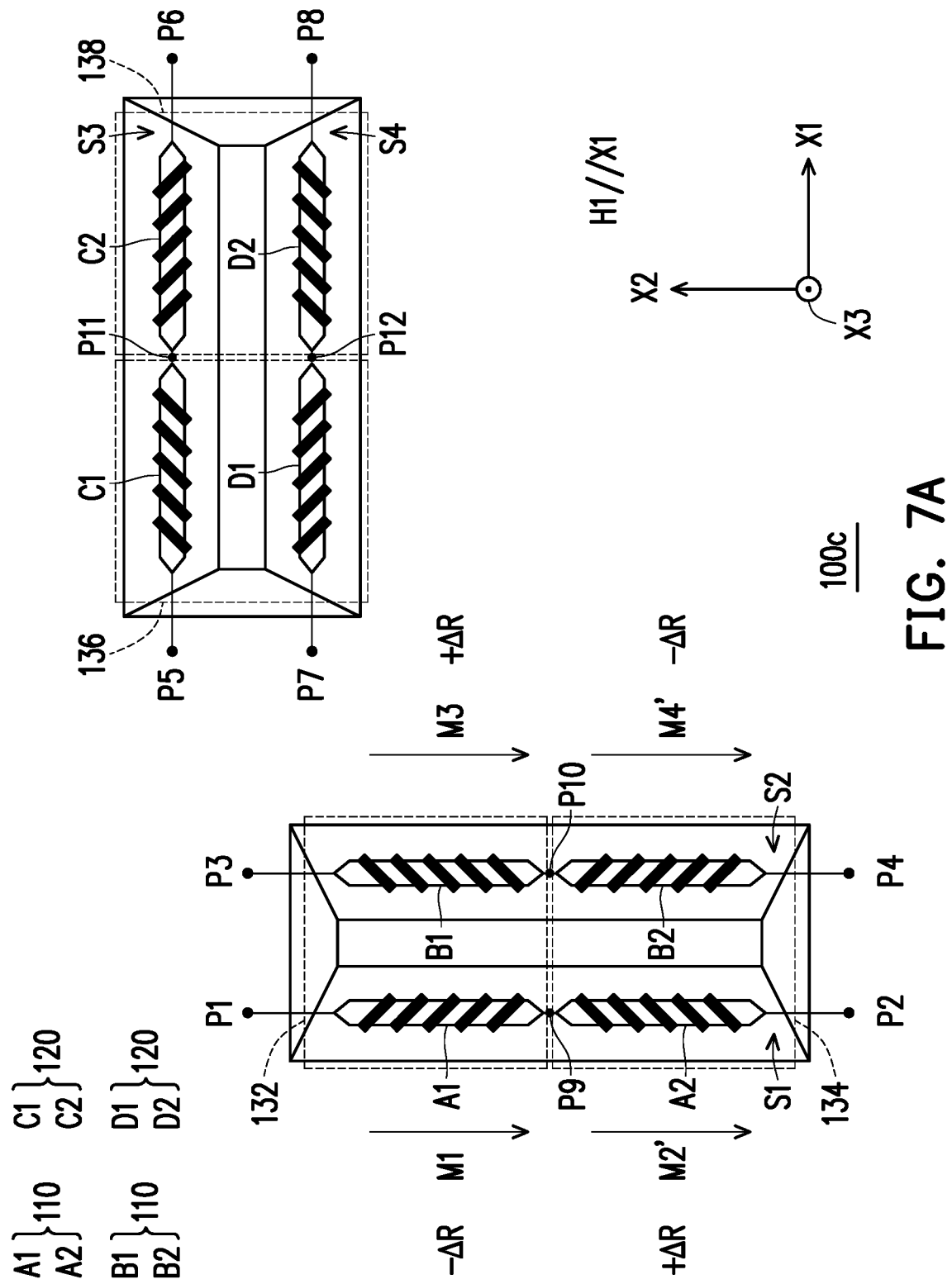
FIG. 7A, FIG. 7B, and FIG. 7C are schematic top views of a magnetic field sensing device according to yet another embodiment of the invention and respectively illustrate parameter changes caused by magnetic field components of an external magnetic field in the first direction, the second direction, and the third direction.
Figure 7B:
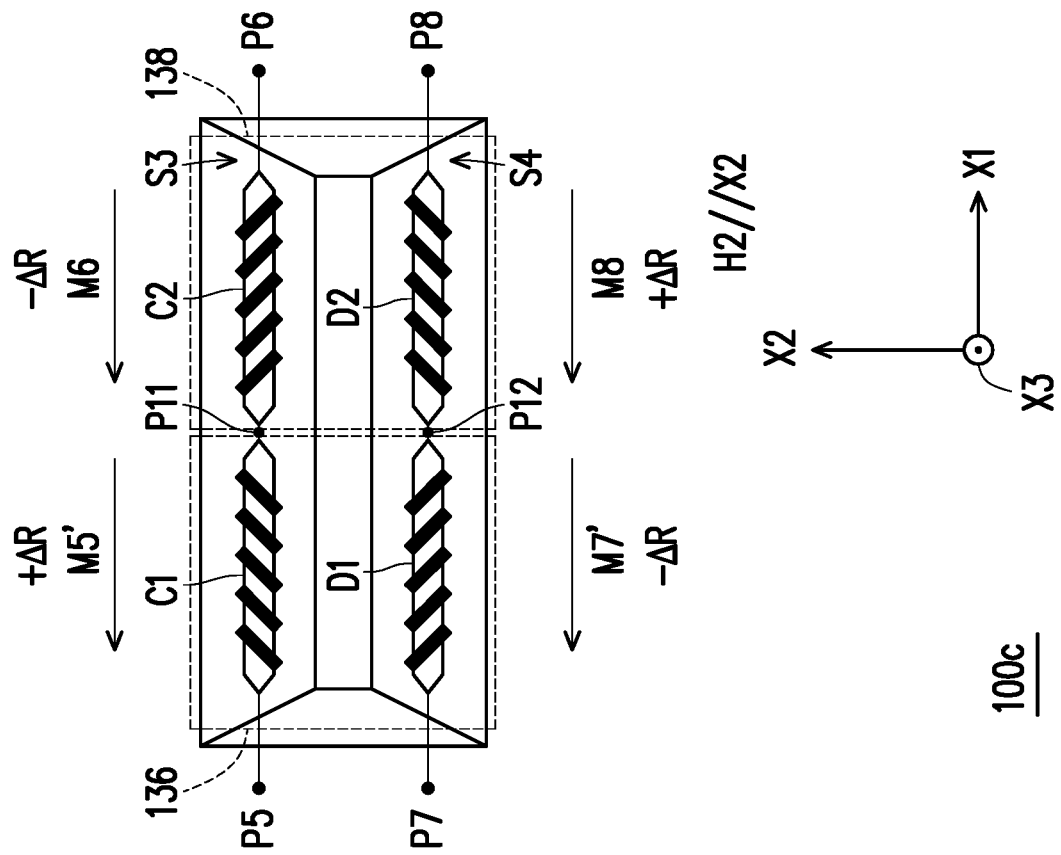
Figure 7B:
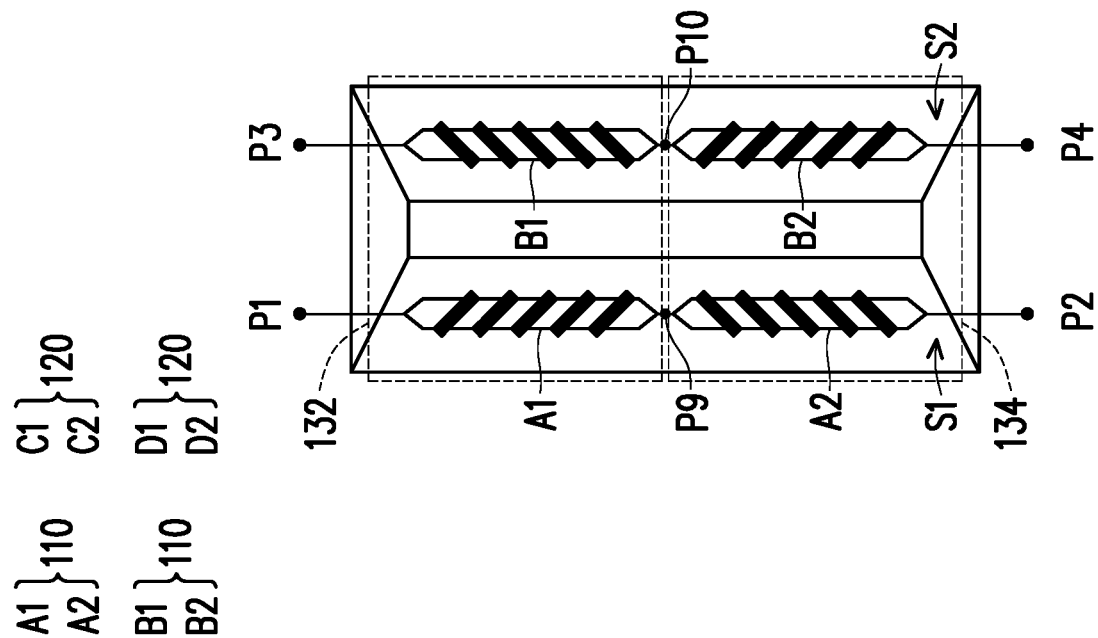
Figure 7C:
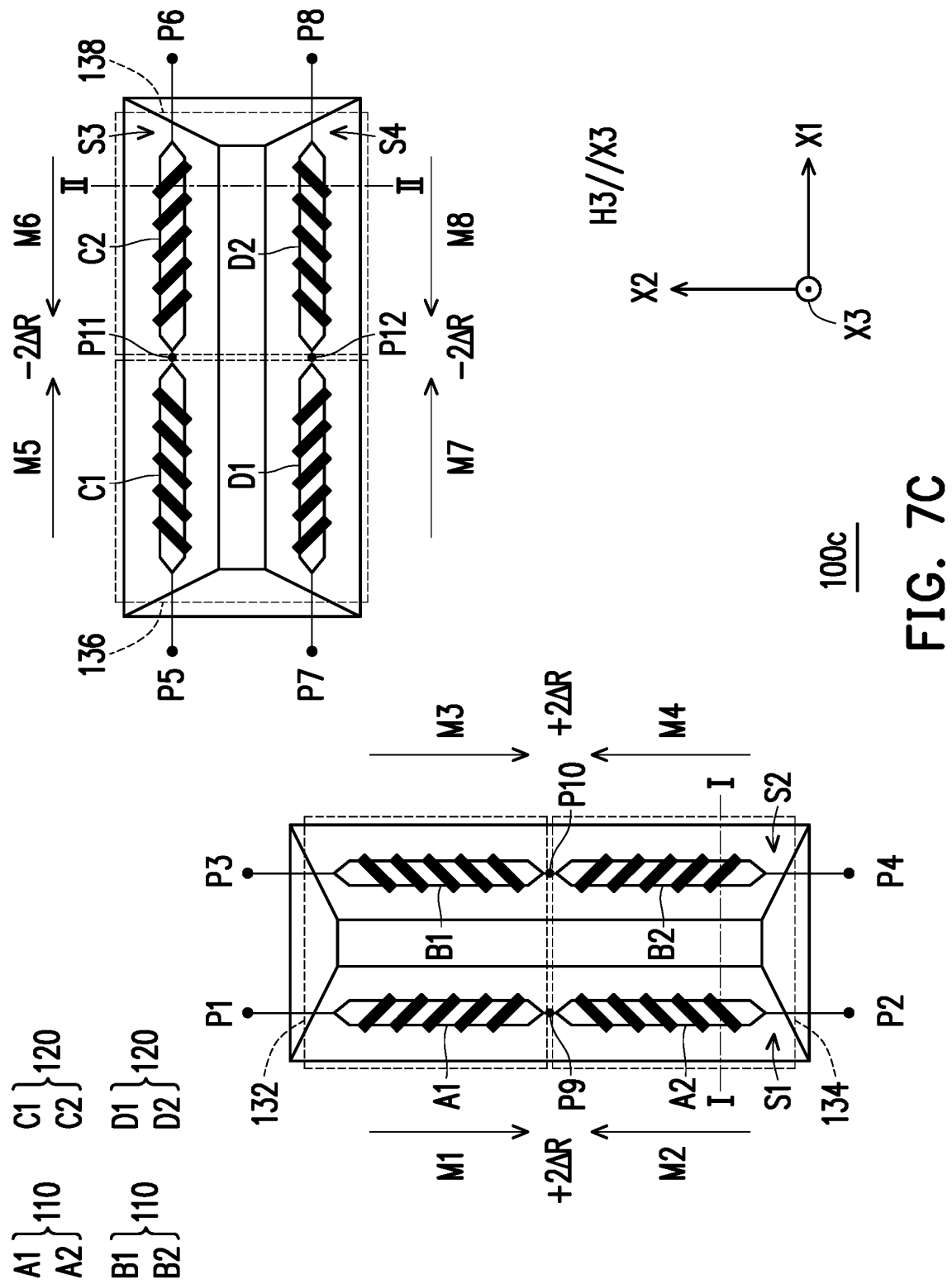

FIG. 7A, FIG. 7B, and FIG. 7C are schematic top views of a magnetic field sensing device according to yet another embodiment of the invention and respectively illustrate parameter changes caused by magnetic field components of an external magnetic field in the first direction, the second direction, and the third direction. With reference to FIG. 7A, FIG. 7B, and FIG. 7C, a magnetic field sensing device 100*c* of this embodiment is similar to the magnetic field sensing device 100 of FIG. 1A to FIG. 1C, and a difference therebetween is provided as follows. In a first time period of the three different time periods, as shown in FIG. 7A, the end points P5 to P8 are not electrically connected, so no signal is outputted by the second magnetoresistor units 120. The end point P1 is electrically connected to the end point P3, and the end point P2 is electrically connected to the end point P4 to form a Wheatstone full bridge. The magnetization direction setting device 134 presets the magnetization directions M2' and M4' of the anisotropic magnetoresistors A2 and B2 to be towards the inverse direction of the second direction X2. Further, the end point P1 receives the reference voltage VDD, and the end point P4 is connected to the ground. At this time, a voltage difference between the end point P9 between the anisotropic magnetoresistor A1 and the anisotropic magnetoresistor A2 and the end point P10 between the anisotropic magnetoresistor B1 and the anisotropic magnetoresistor B2 is (VDD)×(ΔR/R), which may be used as an output signal. This output signal is a differential signal, and its magnitude corresponds to a magnitude of the magnetic field component H1 in the first direction X1.

In a second time period of the three different time periods, as shown in FIG. 7B, the end points P1 to P4 are not electrically connected, so no signal is outputted by the first magnetoresistor units 110. The end point P5 is electrically connected to the end point P7, and the end point P6 is electrically connected to the end point P8 to form a Wheatstone full bridge. The magnetization direction setting device 136 presets the magnetization directions M5' and M7' of the anisotropic magnetoresistors C1 and D1 to be towards the inverse direction of the first direction X1. Further, the end point P5 receives the reference voltage VDD, and the end point P8 is connected to the ground. At this time, a voltage difference between the end point P11 between the anisotropic magnetoresistor C1 and the anisotropic magnetoresistor C2 and the end point P12 between the anisotropic magnetoresistor D1 and the anisotropic magnetoresistor D2 is (VDD)×(−ΔR/R), which may be used as an output signal. This output signal is a differential signal, and its magnitude corresponds to a magnitude of the magnetic field component H2 in the second direction X2.

Further, in a third time period of the three time periods, as shown in FIG. 7C, similar to the connection manner shown in FIG. 1C, the end point P1 is electrically connected to the end point P5, the end point P2 is electrically connected to the end point P7, the end point P3 is electrically connected to the end point P8, and the end point P4 is electrically connected to the end point P6. Moreover, the end point P6 receives the reference voltage VDD, the end point P2 is coupled to the ground, and a combination of magnetization directions is as shown in FIG. 1C. In this way, a voltage difference between the end point P1 and the end point P3 is (VDD)×(ΔR/R), which may be used as an output signal. This output signal is a differential signal, and its magnitude corresponds to the magnitude of the magnetic field component H3 in the third direction X3.

In view of the foregoing, in the magnetic field sensing device provided by the embodiments of the invention, the magnetic field sensing axes of the first magnetoresistor units are parallel to the plane formed by the first direction and the third direction and are inclined with respect to the first direction and the third direction. Further, the magnetic field sensing axes of the second magnetoresistor units are parallel to the plane formed by the second direction and the third direction and are inclined with respect to the second direction and the third direction. Therefore, the magnetic field sensing device provided by the embodiments of the invention can have a simplified structure and simultaneously realize magnetic field measurement in multiple dimensions, and thus, the magnetic field sensing device may feature smaller volume and advantages of increasing flexibility in application and lowering the manufacturing costs. In addition, the magnetic field sensing device provided by the embodiments of the invention can provide reduced device volume without sacrificing performance (e.g., a response speed) of the device.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A magnetic field sensing device, comprising:
a plurality of first magnetoresistor units, disposed in three-dimensional space formed by a first direction, a second direction, and a third direction, wherein magnetic field sensing axes of the first magnetoresistor units are parallel to a plane formed by the first direction and the third direction and are inclined with respect to the first direction and the third direction; and
a plurality of second magnetoresistor units, disposed in the three-dimensional space, wherein magnetic field sensing axes of the second magnetoresistor units are parallel to a plane formed by the second direction and the third direction and are inclined with respect to the second direction and the third direction,
wherein the first magnetoresistor units and the second magnetoresistor units are electrically connected to form a plurality of different kinds of Wheatstone bridges in a plurality of different time periods, respectively, or are electrically connected to form one kind of Wheatstone bridge in the different time periods, but the first magnetoresistor units and the second magnetoresistor units connected by the one kind of Wheatstone bridge are switched into a plurality of different magnetization direction combinations in the different time periods, respectively, by a plurality of magnetization direction setting devices respectively disposed beside the first magnetoresistor units and the second magnetoresistor units, so as to measure a plurality of magnetic field components in a plurality of directions in the three-dimensional space.

2. The magnetic field sensing device as claimed in claim 1, wherein the different kinds of Wheatstone bridges or the one kind of Wheatstone bridge measure or measures magnetic field components in a fourth direction, a fifth direction, and the third direction in three different time periods, respectively, and output or outputs three signals respectively corresponding to the magnetic field components in the fourth direction, the fifth direction, and the third direction, the first direction, the second direction, the third direction, the fourth direction, and the fifth direction are different from one another, the fourth direction is a sum vector direction of the first direction and the second direction, and the fifth direction is a difference vector direction of the first direction and the second direction.

3. The magnetic field sensing device as claimed in claim 2, wherein a signal outputted by the different kinds of Wheatstone bridges or the one kind of Wheatstone bridge is a differential signal corresponding to a magnetic field component in one of the fourth direction, the fifth direction, and the third direction in any one of the three different time periods, and differential signals generated by the different kinds of Wheatstone bridges or the one kind of Wheatstone bridge and corresponding to magnetic field components in directions other than the one of the fourth direction, the fifth direction, and the third direction are zero at this time.

4. The magnetic field sensing device as claimed in claim 2, wherein the first direction, the second direction, and the third direction are perpendicular to one another, the fourth direction is perpendicular to the fifth direction, and the fourth direction has an included angle of 45 degrees with both the first direction and the second direction.

5. The magnetic field sensing device as claimed in claim 1, wherein each of the first magnetoresistor units and the second magnetoresistor units comprises at least one anisotropic magnetoresistor.

6. The magnetic field sensing device as claimed in claim 5, wherein the at least one anisotropic magnetoresistor of each of the first magnetoresistor units extends in the second direction, and the at least one anisotropic magnetoresistor of each of the second magnetoresistor units extends in the first direction.

7. The magnetic field sensing device as claimed in claim 1, wherein the first direction, the second direction, and the third direction are perpendicular to one another.

8. The magnetic field sensing device as claimed in claim 1, wherein the magnetization direction setting devices respectively set magnetization directions of the first magnetoresistor units and the second magnetoresistor units.

9. The magnetic field sensing device as claimed in claim 1, further comprising a substrate and an insulating layer disposed on the substrate, the insulating layer having a plurality of slope surfaces, wherein the first magnetoresistor units and the second magnetoresistor units are disposed on the slope surfaces, respectively.

10. The magnetic field sensing device as claimed in claim 9, wherein the magnetization direction setting devices respectively set magnetization directions of the first magnetoresistor units and the second magnetoresistor units, wherein a part of the magnetization direction setting devices are disposed between the first magnetoresistor units and the substrate, and the other part of the magnetization direction setting devices are disposed between the second magnetoresistor units and the substrate.

11. The magnetic field sensing device as claimed in claim 9, wherein the magnetization direction setting devices respectively set magnetization directions of the first magnetoresistor units and the second magnetoresistor units, wherein the first magnetoresistor units are disposed between a part of the magnetization direction setting devices and the substrate, and the second magnetoresistor units are disposed between the other part of the magnetization direction setting devices and the substrate.

12. The magnetic field sensing device as claimed in claim 9, wherein the substrate is a semiconductor substrate, a glass substrate, or a circuit substrate.

13. The magnetic field sensing device as claimed in claim 1, wherein each of the first magnetoresistor units comprises a plurality of first magnetoresistors, one part and the other part among the first magnetoresistors are set to have opposite magnetization directions, each of the second magnetoresistor units comprises a plurality of second magnetoresistors, and one part and the other part among the second magnetoresistors are set to have opposite magnetization directions.

14. The magnetic field sensing device as claimed in claim 1, further comprising a switching circuit electrically connected to the first magnetoresistor units and the second magnetoresistor units, wherein the switching circuit electrically connects the first magnetoresistor units and the second magnetoresistor units to form the different kinds of Wheatstone bridges in the different time periods, respectively.

15. The magnetic field sensing device as claimed in claim 1, wherein the first magnetoresistor units and the second magnetoresistor units are electrically connected to form different kinds of Wheatstone full bridges in the different time periods, respectively.

16. The magnetic field sensing device as claimed in claim 1, wherein the first magnetoresistor units and the second magnetoresistor units are electrically connected to form one kind of Wheatstone full bridge in the different time periods, but the first magnetoresistor units and the second magnetoresistor units connected by the one kind of Wheatstone full bridge are switched into the different magnetization direction combinations in the different time periods.

17. The magnetic field sensing device as claimed in claim 1, wherein the first magnetoresistor units are electrically connected to form a Wheatstone full bridge or a Wheatstone half bridge in a first time period of the three different time periods so as to sense a magnetic field component in the first direction, the second magnetoresistor units are electrically connected to form a Wheatstone full bridge or a Wheatstone half bridge in a second time period of the three different time periods so as to sense a magnetic field component in the second direction, and the first magnetoresistor units and the second magnetoresistor units are electrically connected to form a Wheatstone full bridge in a third time period of the three different time periods so as to sense the magnetic field component in the third direction.

* * * * *